(12) United States Patent
Park et al.

(10) Patent No.: US 12,295,218 B2
(45) Date of Patent: *May 6, 2025

(54) DISPLAY PANEL AND DISPLAY DEVICE INCLUDING THE SAME

(71) Applicant: Samsung Display Co., Ltd., Yongin-Si (KR)

(72) Inventors: Hyungjun Park, Seoul (KR); Wonkyu Kwak, Seongnam-si (KR); Yoon-Jong Cho, Seongnam-si (KR); Ji-Eun Lee, Seoul (KR); Jin Jeon, Seoul (KR); Sungho Kim, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 572 days.

This patent is subject to a terminal disclaimer.

(21) Appl. No.: 17/485,574

(22) Filed: Sep. 27, 2021

(65) Prior Publication Data

US 2022/0173194 A1 Jun. 2, 2022

(30) Foreign Application Priority Data

Dec. 2, 2020 (KR) ........................ 10-2020-0167058

(51) Int. Cl.
*H10K 59/126* (2023.01)
*H10K 59/131* (2023.01)
*H10K 59/65* (2023.01)

(52) U.S. Cl.
CPC ......... *H10K 59/126* (2023.02); *H10K 59/131* (2023.02); *H10K 59/65* (2023.02)

(58) Field of Classification Search
CPC .... H10K 59/126; H10K 59/131; H10K 59/65; H10K 77/10; H10K 59/124; H10K 59/60; H10K 59/122; H10K 59/1213; H01L 27/1218; H01L 27/1225

See application file for complete search history.

(56) References Cited

U.S. PATENT DOCUMENTS

| | | | |
|---|---|---|---|
| 9,985,082 B2* | 5/2018 | Lee | H10K 59/126 |
| 10,615,193 B2* | 4/2020 | Gui | H01L 29/6675 |
| 11,856,823 B2* | 12/2023 | Cho | H10K 77/10 |
| 2009/0236604 A1* | 9/2009 | Bae | G02F 1/13458 |
| | | | 257/E33.001 |
| 2017/0186783 A1* | 6/2017 | Hu | H01L 29/78633 |

(Continued)

FOREIGN PATENT DOCUMENTS

| | | | |
|---|---|---|---|
| CN | 107256872 A | * 10/2017 | G02F 1/136209 |
| KR | 10-2007-0072207 A | 7/2007 | |

(Continued)

*Primary Examiner* — Bitew A Dinke

(74) *Attorney, Agent, or Firm* — Innovation Counsel LLP

(57) ABSTRACT

A display panel includes a substrate, a first barrier layer disposed on the substrate, a shielding pattern disposed on the first barrier layer, a second barrier layer covering the shielding pattern and disposed on the first barrier layer, a first active pattern disposed on the second barrier layer and overlapping the shielding pattern in a plan view, a gate electrode disposed on the first active pattern, an emission control line disposed on the first active pattern and adjacent to one side of the gate electrode in a plan view, and an upper compensation control line disposed on the emission control line and adjacent to the other side of the gate electrode in a plan view.

17 Claims, 35 Drawing Sheets

(56) References Cited

U.S. PATENT DOCUMENTS

| | | | |
|---|---|---|---|
| 2018/0166520 A1* | 6/2018 | Kang | H10K 59/873 |
| 2019/0006521 A1 | 1/2019 | Noh et al. | |
| 2019/0081090 A1* | 3/2019 | Lee | H01L 27/0296 |
| 2019/0204668 A1* | 7/2019 | Yang | H01L 29/7869 |
| 2019/0229131 A1* | 7/2019 | Chung | H01L 27/1248 |
| 2019/0280224 A1* | 9/2019 | Wang | H10K 59/12 |
| 2020/0083309 A1* | 3/2020 | Wang | H10K 59/131 |
| 2020/0105849 A1* | 4/2020 | Kim | H10K 59/1213 |
| 2020/0111433 A1* | 4/2020 | Kikuchi | H01L 27/1251 |
| 2020/0227563 A1* | 7/2020 | Yamaguchi | H01L 21/02266 |
| 2021/0013153 A1* | 1/2021 | Yao | H01L 27/1222 |
| 2021/0091233 A1* | 3/2021 | Yang | H01L 29/6675 |
| 2021/0119055 A1* | 4/2021 | Toda | H01L 29/78618 |
| 2021/0193819 A1* | 6/2021 | Ouyang | H10K 59/122 |
| 2021/0242297 A1* | 8/2021 | Yuan | H10K 59/124 |
| 2021/0405411 A1* | 12/2021 | Hanada | H01L 27/1225 |
| 2022/0109042 A1* | 4/2022 | Kim | H10K 59/131 |
| 2022/0320211 A1* | 10/2022 | Zhao | H10K 59/131 |
| 2024/0090279 A1* | 3/2024 | Cho | H10K 59/1213 |

FOREIGN PATENT DOCUMENTS

| | | |
|---|---|---|
| KR | 10-1833235 B1 | 4/2018 |
| WO | 2020-111420 A1 | 6/2020 |

\* cited by examiner

DISPLAY PANEL AND DISPLAY DEVICE INCLUDING THE SAME

This application claims priority to Korean Patent Application No. 10-2020-0167058, filed on Dec. 2, 2020, and all the benefits accruing therefrom under 35 U.S.C. § 119, the content of which in its entirety is herein incorporated by reference.

BACKGROUND

1. Field

Implementations of the inventive concept relate generally to a display panel and a display device including the same. Specifically, implementations of the inventive concept relate generally to a display panel including a shielding pattern and a display device including the display panel.

2. Discussion of the Background

A conventional display device includes a display panel and transistors including an active pattern are disposed on the display panel. An electric field may be generated inside the display panel by signals and voltages provided to the display panel. Organic materials included in the organic film layer of the display panel may be polarized by the electric field. The polarized organic materials may affect electrical properties of the active pattern of the display panel. Accordingly, electrical characteristics of the transistors may be changed. In addition, the polarization phenomenon may be further accelerated by light incident on the display panel. Therefore, the display quality of the conventional display device may be deteriorated.

SUMMARY

Embodiments provide a display panel with improved display quality.

Embodiments provide a display device including the display panel.

A display panel according to an embodiment may include a substrate, a first barrier layer disposed on the substrate, a shielding pattern disposed on the first barrier layer, a second barrier layer covering the shielding pattern and disposed on the first barrier layer, a first active pattern disposed on the second barrier layer and overlapping the shielding pattern in a plan view, a gate electrode disposed on the first active pattern, an emission control line disposed on the first active pattern and adjacent to one side of the gate electrode in a plan view, and an upper compensation control line disposed on the emission control line and adjacent to the other side of the gate electrode in a plan view.

According to an embodiment, the shielding pattern may include a first pattern and a second pattern connected to the first pattern and the first pattern and the second pattern are symmetrical about a line of symmetry which passes through a middle of the first pattern and the second pattern.

According to an embodiment, the first pattern may include a first portion overlapping the gate electrode in a plan view.

According to an embodiment, the first portion may completely overlap the gate electrode in a plan view.

According to an embodiment, the display panel may further include a high power voltage line disposed on the upper compensation control line and provided with a high power voltage. The first pattern may further include a second portion overlapping the high power voltage line in a plan view.

According to an embodiment, the substrate may include an organic film.

According to an embodiment, the shielding pattern may include amorphous silicon.

According to an embodiment, the display panel may further include a second active pattern disposed on the emission control line. The first active pattern may include polycrystalline silicon and the second active pattern may include an oxide semiconductor.

According to an embodiment, positive ions may be doped in the first active pattern, and the positive ions may be doped in the shielding pattern.

According to an embodiment, positive ions may be doped in the first active pattern, and the negative ions may be doped in the shielding pattern.

According to an embodiment, a constant voltage may be applied to the shielding pattern.

According to an embodiment, the shielding pattern may be electrically floating.

According to an embodiment, the display panel may further include a third barrier layer disposed under the substrate and an organic film layer disposed under the third barrier layer.

According to an embodiment, a thickness of the first barrier layer may be smaller than a thickness of the second barrier layer.

According to an embodiment, a thickness of the third barrier layer may be equal to a sum of a thickness of the first barrier layer and a thickness of the second barrier layer.

According to an embodiment, the display panel may further include a second active pattern disposed on the emission control line and a lower compensation control line disposed between the gate electrode and the second active pattern. The upper compensation control line may overlap the lower compensation control line in a plan view and may be electrically connected to the lower compensation line.

A display panel according to another embodiment may include a substrate, a first barrier layer disposed on the first organic film layer, a shielding pattern disposed on the first barrier layer and having an island shape, a second barrier layer covering the shielding pattern and disposed on the first barrier layer, a first active pattern disposed on the second barrier layer and overlapping the shielding pattern in a plan view, a gate electrode disposed on the first active pattern, an emission control line disposed on the first active pattern and adjacent to one side of the gate electrode in a plan view, and an upper compensation control line disposed on the second active pattern and adjacent to the other side of the gate electrode in a plan view.

According to an embodiment, the shielding pattern may include a first portion overlapping the gate electrode in a plan view and a second portion overlapping the upper compensation control line in a plan view.

A display device according to an embodiment may include a display panel. The display panel may include a substrate, a first barrier layer disposed on the substrate, a shielding pattern disposed on the first barrier layer, a second barrier layer covering the shielding pattern and disposed on the first barrier layer, a first active pattern disposed on the second barrier layer and overlapping the shielding pattern in a plan view, a gate electrode disposed on the first active pattern, an emission control line disposed on the first active pattern and adjacent to one side of the gate electrode in a plan view, and an upper compensation control line disposed on the second active pattern and adjacent to the other side of the gate electrode in a plan view.

According to an embodiment, the display device may further include an optical sensor disposed under the display panel and overlapping a fingerprint recognition area in a plan view and an air layer disposed between the display panel and the optical sensor, and overlapping the fingerprint recognition area in a plan view. The shielding pattern may overlap the fingerprint recognition area in a plan view.

Therefore, a display panel according to embodiments of present inventive concept may include a shielding pattern disposed between a substrate which includes an organic film layer and an active pattern, and having a mesh structure. The shielding pattern may shield the active pattern from polarized organic materials included in the organic film layer. Accordingly, an electrical effect (e.g., formation of a back channel) due to the organic materials may not be applied to the active pattern, and electrical characteristics of transistors including the active pattern may not be changed. Accordingly, display quality of the display panel may be improved.

It is to be understood that both the foregoing general description and the following detailed description are examples and are intended to provide further explanation of the inventive concept as claimed.

BRIEF DESCRIPTION OF THE DRAWINGS

The accompanying drawings, which are included to provide a further understanding of the inventive concept and are incorporated in and constitute a part of this specification, illustrate embodiments of the inventive concept together with the description.

DETAILED DESCRIPTION

Illustrative, non-limiting embodiments will be more clearly understood from the following detailed description in conjunction with the accompanying drawings.

Figure 1:
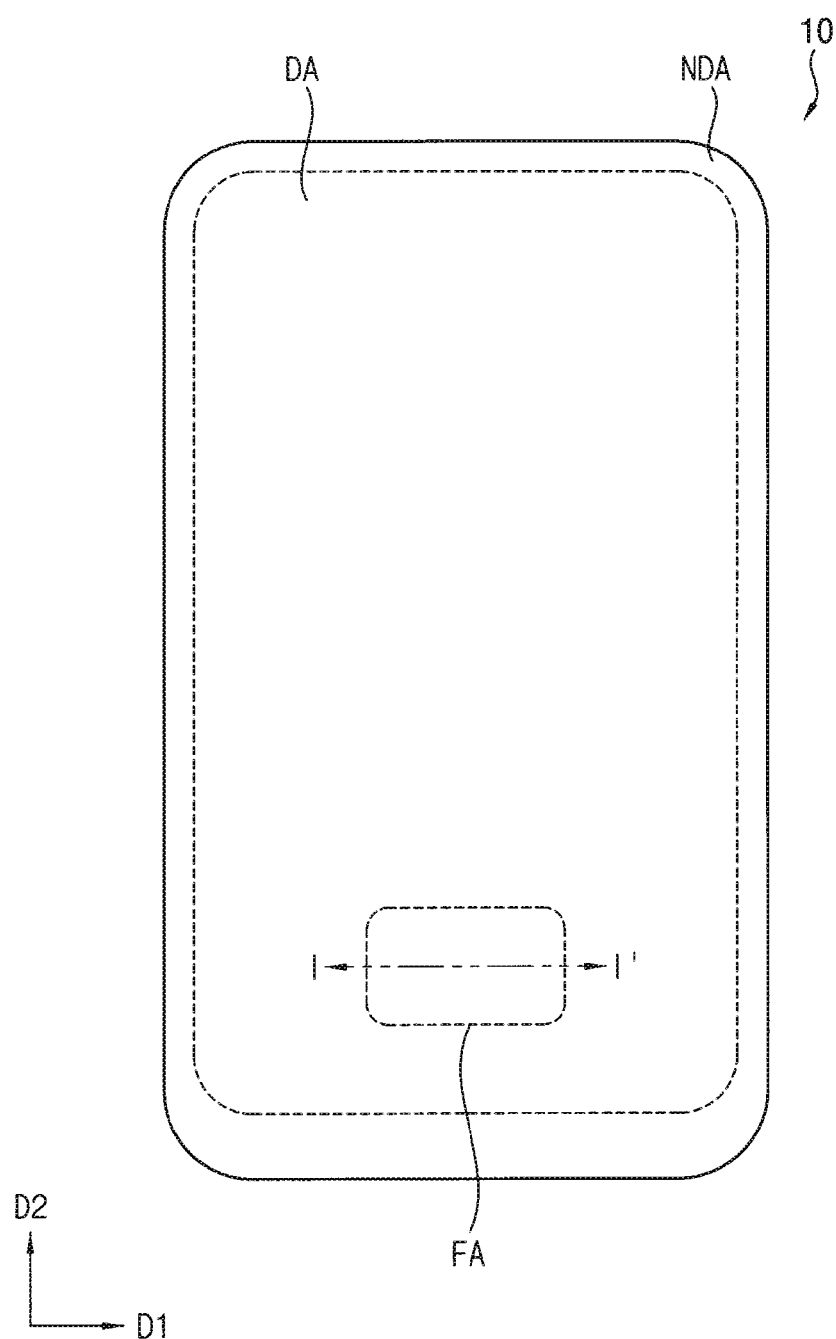
FIG. 1 is a plan view illustrating a display device according to embodiments.
Figure 2:
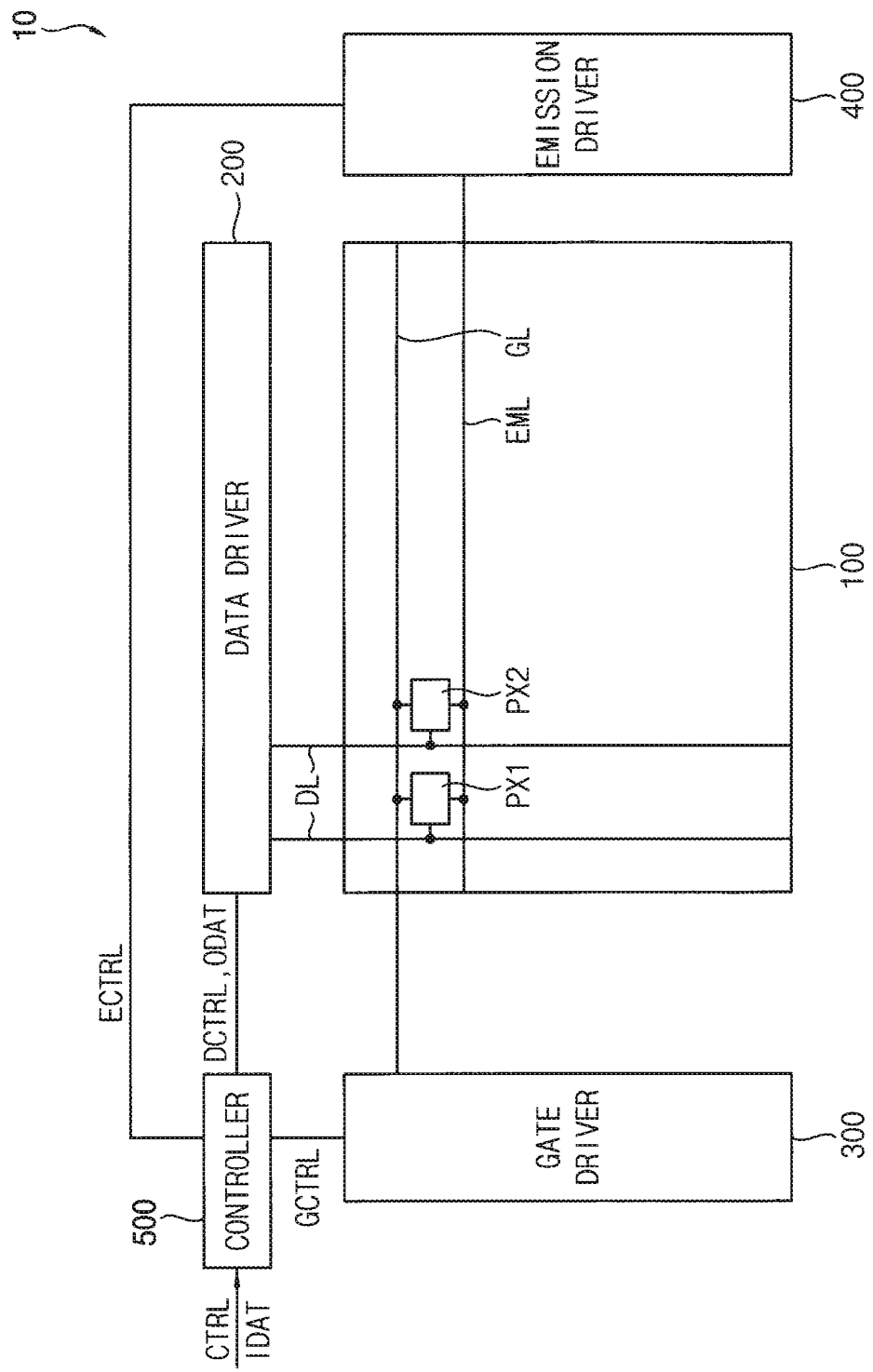
FIG. 2 is a block diagram illustrating the display device of FIG. 1.
Figure 3:
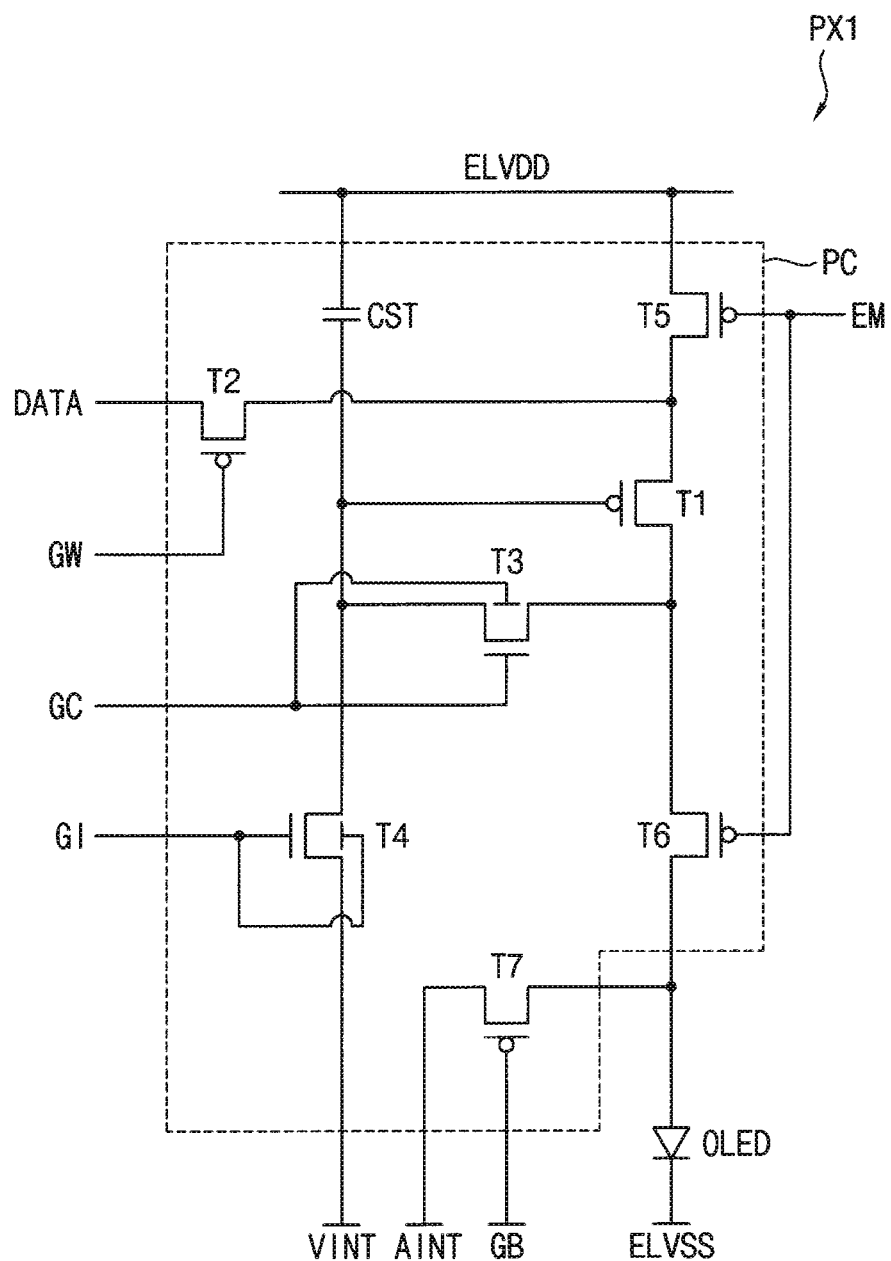
FIG. 3 is a circuit diagram illustrating a pixel circuit and an organic light emitting diode included in the display device of FIG. 2.
Figure 4:
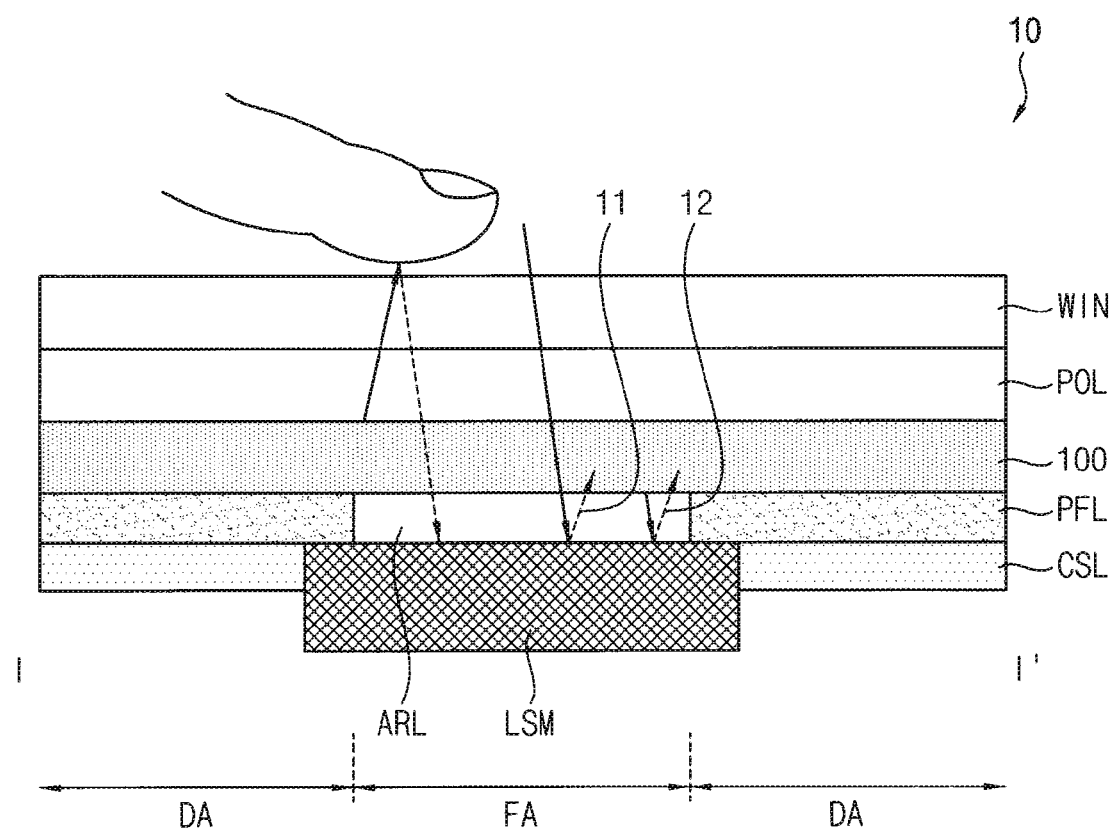
FIG. 4 is a cross-sectional view taken along line I-I' of FIG. 1.

FIG. 1 is a plan view illustrating a display device according to embodiments. FIG. 2 is a block diagram illustrating the display device of FIG. 1. FIG. 3 is a circuit diagram illustrating a pixel circuit and an organic light emitting diode included in the display device of FIG. 2. FIG. 4 is a cross-sectional view taken along line I-I' of FIG. 1.

Referring to FIGS. 1 and 2, a display device 10 according to embodiments of the present inventive concept may include a display area DA and a non-display area NDA. A fingerprint recognition area FA is disposed in the display area DA. The display area DA may have a rectangular shape having a short side extending in a first direction D1 and a long side extending in a second direction D2 crossing the first direction D1. The non-display area NDA may be disposed to surround the display area DA. The display area DA may be disposed surrounding the fingerprint recognition area FA. A display panel 100 may overlap the display area DA and the fingerprint recognition area FA. A data driver 200, a gate driver 300, an emission driver 400, and a timing controller 500 may be disposed in the non-display area NDA.

First and second pixel structures PX1 and PX2 may be disposed in the display panel 100. Each of the first and second pixel structures PX1 and PX2 may be electrically connected to a data line DL, a gate line GL, and an emission control line EML.

The data line DL may be electrically connected to the data driver DDV and may extend along the second direction D2. The data line DL may transmit a data voltage (e.g., a data voltage DATA in FIG. 3).

The gate line GL may be connected to the gate driver 300 and may extend along the first direction D1. The gate line GL may transmit a gate signal (e.g., first to fourth gate signals GW, GC, GI, and GB in FIG. 3).

The emission control line EML may be connected to the emission driver 400 and may extend along the first direction D1. The emission control line EML may transmit an emission control signal (e.g., an emission control signal EM in FIG. 3). For example, an activation period of the emission control signal EM may be an emission period of the display device 10, and an inactivation period of the emission control signal EM may be a non-emission period of the display device 10.

The gate driver 300 may receive a gate control signal GCTRL from the timing controller 500 and may generate the gate signal. For example, the gate signal may include a first gate signal GW, a second gate signal GC, a third gate signal GI, and a fourth gate signal GB.

The data driver 200 may receive output image data ODAT and a data control signal DCTRL from the timing controller 500 and may generate the data voltage DATA. The emission driver 400 may receive an emission driving control signal ECTRL from the timing controller 500 and may generate the emission control signal EM. The timing controller 500 may receive a control signal CTRL and input image data IDAT from an external device, and may control the data driver 200, the gate driver 300, and the emission driver 400.

For example, the data driver 200 and the timing controller 500 may be disposed on a flexible printed circuit board, the gate driver 300 may be mounted in the non-display area NDA adjacent to the left side of the display area DA, and emission driver 400 may be mounted in the non-display area NDA adjacent to the right side of the display area DA. However, positions where the data driver 200, the gate driver 300, the emission driver 400, and the timing controller 500 are disposed are not limited thereto.

Referring to FIGS. 2 and 3, the first pixel structure PX1 may include a pixel circuit PC and an organic light emitting diode OLED. The second pixel structure PX2 may have a circuit structure substantially the same as a circuit structure of the first pixel structure PX1. In an embodiment, the first pixel structure and the second pixel structure PX2 may be symmetrical about a line of symmetry which passes through a middle of the first pixel structure PX1 and the second pixel structure PX2.

The pixel circuit PC may include a first transistor T1, a second transistor T2, a third transistor T3, a fourth transistor T4, a fifth transistor T5, a sixth transistor T6, and a seventh transistor T7 and a storage capacitor CST. The pixel circuit PC may be electrically connected to the organic light emitting diode OLED, and may provide a driving current to the organic light emitting diode OLED.

The organic light emitting diode OLED may include a first terminal (e.g., an anode terminal) and a second terminal (e.g., a cathode terminal). The first terminal may be connected to the sixth transistor T6 and the seventh transistor T7 and the second terminal may receive a low power voltage ELVSS. The organic light emitting diode OLED may generate light having a luminance corresponding to the driving current.

The storage capacitor CST may include a first terminal and a second terminal. The first terminal of the storage capacitor CST may be connected to the first transistor T1 and the second terminal of the storage capacitor CST may receive a high power voltage ELVDD. The storage capacitor CST may maintain a voltage level of a gate terminal of the first transistor T1 during an inactive period of the first gate signal GW.

The first transistor T1 may include a gate terminal, a first terminal (e.g., a source terminal), and a second terminal (e.g., a drain terminal). The gate terminal of the first transistor T1 may be connected to the first terminal of the storage capacitor CST. The first terminal of the first transistor T1 may be connected to the second transistor T2 and may receive the data voltage DATA. The second terminal of the first transistor T1 may be connected to the sixth transistor T6.

The first transistor T1 may generate the driving current based on a voltage difference between the gate terminal and the first terminal of the first transistor T1. For example, the first transistor T1 may be referred to as a driving transistor.

The second transistor T2 may include a gate terminal, a first terminal (e.g., a source terminal), and a second terminal (e.g., a drain terminal). The gate terminal of the second transistor T2 may receive the first gate signal GW through the gate line GL.

The second transistor T2 may be turned on or off in response to the first gate signal GW. For example, when the second transistor T2 is a PMOS transistor, the second transistor T2 may be turned off when the first gate signal GW has a positive voltage level and may be turned on when the first gate signal GW has a negative voltage level. The first terminal of the second transistor T2 may receive the data voltage DATA through the data line DL. The second terminal of the second transistor T2 may provide the data voltage DATA to the first terminal of the first transistor T1 while the second transistor T2 is turned on. For example, the second transistor T2 may be referred to as a switching transistor.

The third transistor T3 may include a gate terminal, a lower gate terminal, a first terminal (e.g., a source terminal), and a second terminal (e.g., a drain terminal). The gate terminal and the lower gate terminal of the third transistor T3 may receive the second gate signal GC. The first terminal of the third transistor T3 may be connected to the second terminal of the first transistor T1. The second terminal of the third transistor T3 may be connected to the gate terminal of the first transistor T1.

The third transistor T3 may be turned on or off in response to the second gate signal GC. For example, when the third transistor T3 is an NMOS transistor, the third transistor T3 may be turned on when the second gate signal GC has a positive voltage level and may be turned off when the second gate signal GC has a negative voltage level.

During a period in which the third transistor T3 is turned on in response to the second gate signal GC, the third transistor T3 may diode-connect the first transistor T1. The third transistor T3 may compensate for a threshold voltage of the first transistor T1. For example, the third transistor T3 may be referred to as a compensation transistor.

The fourth transistor T4 may include a gate terminal, a lower gate terminal, a first terminal (e.g., a source terminal), and a second terminal (e.g., a drain terminal). The gate terminal and the lower gate terminal of the fourth transistor T4 may receive the third gate signal GI. The first terminal of the fourth transistor T4 may be connected to the gate terminal of the first transistor T1. The second terminal of the fourth transistor T4 may receive the gate initialization voltage VINT.

The fourth transistor T4 may be turned on or off in response to the third gate signal GI. For example, when the fourth transistor T4 is an NMOS transistor, the fourth transistor T4 may be turned on when the third gate signal GI has a positive voltage level, and may be turned off when the third gate signal GI has a negative voltage level.

During a period in which the fourth transistor T4 is turned on in response to the third gate signal GI, the gate initialization voltage VINT may be provided to a gate terminal of the first transistor T1. Accordingly, the fourth transistor T4 may initialize the gate terminal of the first transistor T1 to the gate initialization voltage VINT. For example, the fourth transistor T4 may be referred to as a gate initialization transistor.

The fifth transistor T5 may include a gate terminal, a first terminal (e.g., a source terminal), and a second terminal (e.g., a drain terminal). The gate terminal of the fifth transistor T5 may receive the emission control signal EM. The first terminal of the fifth transistor T5 may receive the high power voltage ELVDD. The second terminal of the fifth transistor T5 may be connected to the first transistor T1. When the fifth transistor T5 is turned on in response to the emission control signal EM, the fifth transistor T5 may provide the high power voltage ELVDD to the first transistor T1.

The sixth transistor T6 may include a gate terminal, a first terminal (e.g., a source terminal), and a second terminal (e.g., a drain terminal). The gate terminal of the sixth transistor T6 may receive the emission control signal EM. The first terminal of the sixth transistor T6 may be connected to the first transistor T1. The second terminal of the sixth transistor T6 may be connected to the organic light emitting diode OLED. When the sixth transistor T6 is turned on in response to the emission control signal EM, the sixth transistor T6 may provide the driving current to the organic light emitting diode OLED.

The seventh transistor T7 may include a gate terminal, a first terminal (e.g., a source terminal), and a second terminal (e.g., a drain terminal). The gate terminal of the seventh transistor T7 may receive the fourth gate signal GB. The first terminal of the seventh transistor T7 may be connected to the organic light emitting diode OLED. The second terminal of the seventh transistor T7 may receive an anode initialization voltage AINT.

When the seventh transistor T7 is turned on in response to the fourth gate signal GB, the seventh transistor T7 may provide the anode initialization voltage AINT to the organic light emitting diode OLED. Accordingly, the seventh transistor T7 may initialize the first terminal of the organic light emitting diode OLED to the anode initialization voltage AINT. For example, the seventh transistor T7 may be referred to as an anode initialization transistor.

In an embodiment, the first, second, fifth, sixth, and seventh transistors T1, T2, T5, T6, and T7 may be PMOS transistors, and the third and fourth transistors T3 and T4 may be NMOS transistors. Accordingly, a first active pattern of the PMOS transistors may include polycrystalline silicon doped with positive ions, and a second active pattern of the NMOS transistors may include an oxide semiconductor. In addition, the first gate signal GW, the emission control signal EM, and the fourth gate signal GB for turning on each of the second, the fifth, the sixth, and the seventh transistors T2, T5, T6, and T7 may have a negative voltage level, and the second gate signal GC and the third gate signal GI for turning on each of the third and the fourth transistors T3 and T4 may have a positive voltage level.

Meanwhile, the connection structure of the pixel circuit PC shown in FIG. 3 is an example and may be variously changed.

Referring to FIGS. 1 and 4, the display device 10 may include the display panel 100, an optical sensor LSM, and functional layers disposed above and below the display panel 100. For example, the functional layers may include a cushion layer CSL, a protective film PFL, an air layer ARL, a polarizing plate POL, and a window WIN. In addition, an adhesive layer may be disposed between the functional layers, and the adhesive layer may include an optically clear adhesive OCA.

The display panel 100 may overlap the display area DA and the fingerprint recognition area FA. As described above, the display panel 100 may include the first and second pixel structures PX1 and PX2. For example, the first and second pixel structures PX1 and PX2 may overlap the fingerprint recognition area FA.

The protective film PFL may be disposed under the display panel 100. The protective film PFL may overlap the display area DA and may not overlap the fingerprint recognition area FA. For example, an opening overlapping the fingerprint recognition area FA may be formed in the protective film PFL. The protective film PFL may include a plastic material and may support the display panel 100.

The air layer ARL may be disposed under the display panel 100. The air layer ARL may overlap the fingerprint recognition area FA. For example, the air layer ARL may be formed in the opening. Light may be easily transmitted to the optical sensor LSM via the air layer ARL.

The cushion layer CSL may be disposed under the protective film PFL. The cushion layer CSL may overlap the display area DA and may not overlap the fingerprint recognition area FA. In other words, an opening overlapping the fingerprint recognition area FA may be formed in the cushion layer CSL. The cushion layer CSL may include an elastic body and may protect the display panel 100 from external impact.

The optical sensor LSM may be disposed under the protective film PFL. The optical sensor LSM may overlap the fingerprint recognition area FA. In other words, the optical sensor LSM may be disposed in the opening formed in the cushion layer CSL. The optical sensor LSM may recognize a user's fingerprint. For example, light emitted from the display panel 100 may be reflected by the user's finger, and the optical sensor LSM may detect the light reflected from the user's finger. In order for the optical sensor LSM to detect light, the optical sensor LSM may be exposed through the air layer ARL.

The polarization layer POL may be disposed on the display panel 100. The polarizing layer POL may reduce reflection of external light.

The window WIN may be disposed on the polarizing layer POL. The window WIN may be made of glass, plastic, or the like, and may protect the display panel 100 from external impact.

Meanwhile, as the air layer ARL is disposed under the display panel 100, light may be incident to the display panel 100 overlapping the fingerprint recognition area FA. For example, the light 11 incident from the outside and reflected from the optical sensor LSM and/or the light 12 emitted from the display panel 100 and reflected from the optical sensor LSM may be incident to the display panel 100.

A conventional display device includes a display panel, and transistors including an active pattern are disposed on the display panel. An electric field may be generated inside the display panel by signals and voltages provided to the display panel. Organic materials included in the organic film layer of the display panel may be polarized by the electric field. The polarized organic materials may affect electrical properties of the active pattern of the display panel. Accordingly, electrical characteristics of the transistors may be changed. In addition, the polarization phenomenon may be further accelerated by light incident on the display panel. Therefore, the display quality of a conventional display device may be deteriorated.

The display device 10 according to embodiments may include a shielding pattern disposed inside the display panel 100. The shielding pattern may prevent the polarized organic materials from affecting electrical properties of the first and second active patterns. Accordingly, electrical characteristics of the transistors may not be changed. Accordingly, the display quality of the display device 10 may be improved. It will be described in detail below.

FIGS. 5 to 16 are layout diagrams illustrating a display device according to an embodiment. FIG. 17 is a cross-sectional view illustrating an example taken along line II-II' of FIG. 16. FIG. 18 is a cross-sectional view illustrating another example taken along line II-II' of FIG. 16.

Figure 5:
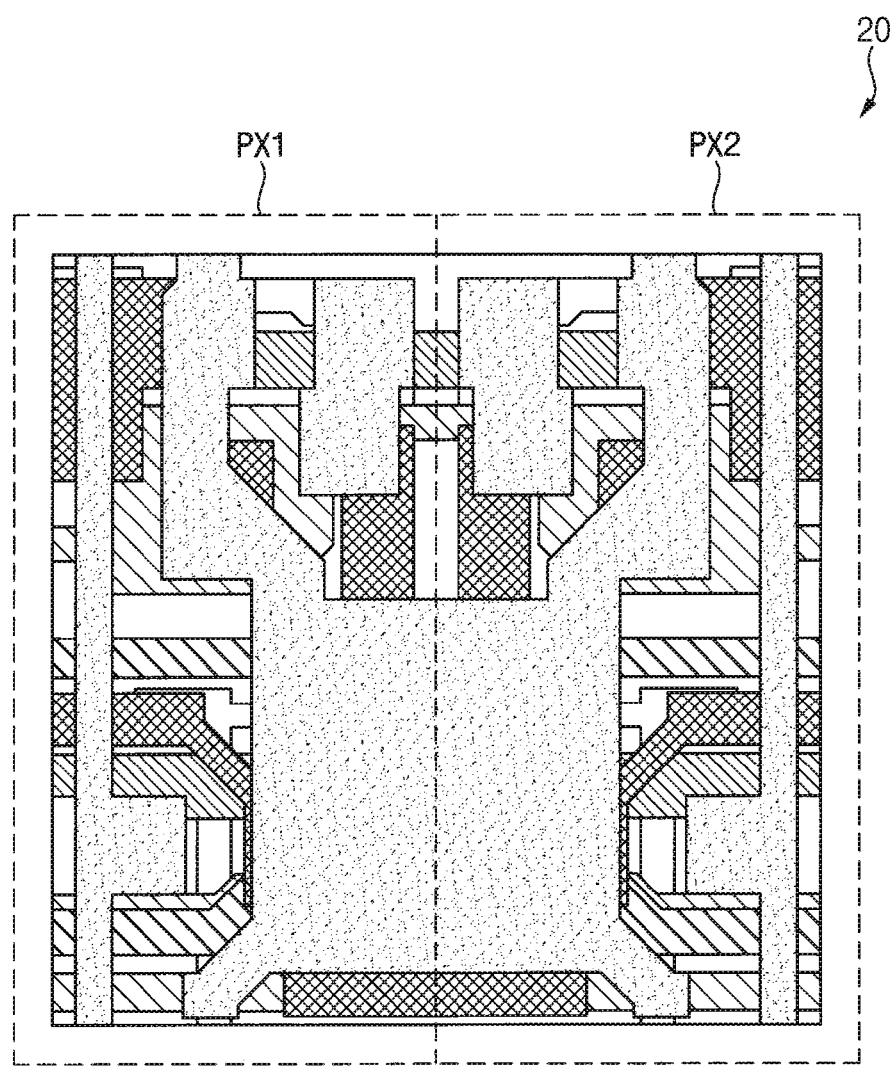
FIGS. 5, 6, 7, 8, 9, 10, 11, 12, 13, 14, 15 and 16 are layout diagrams illustrating a display device according to an embodiment.
Figure 6:
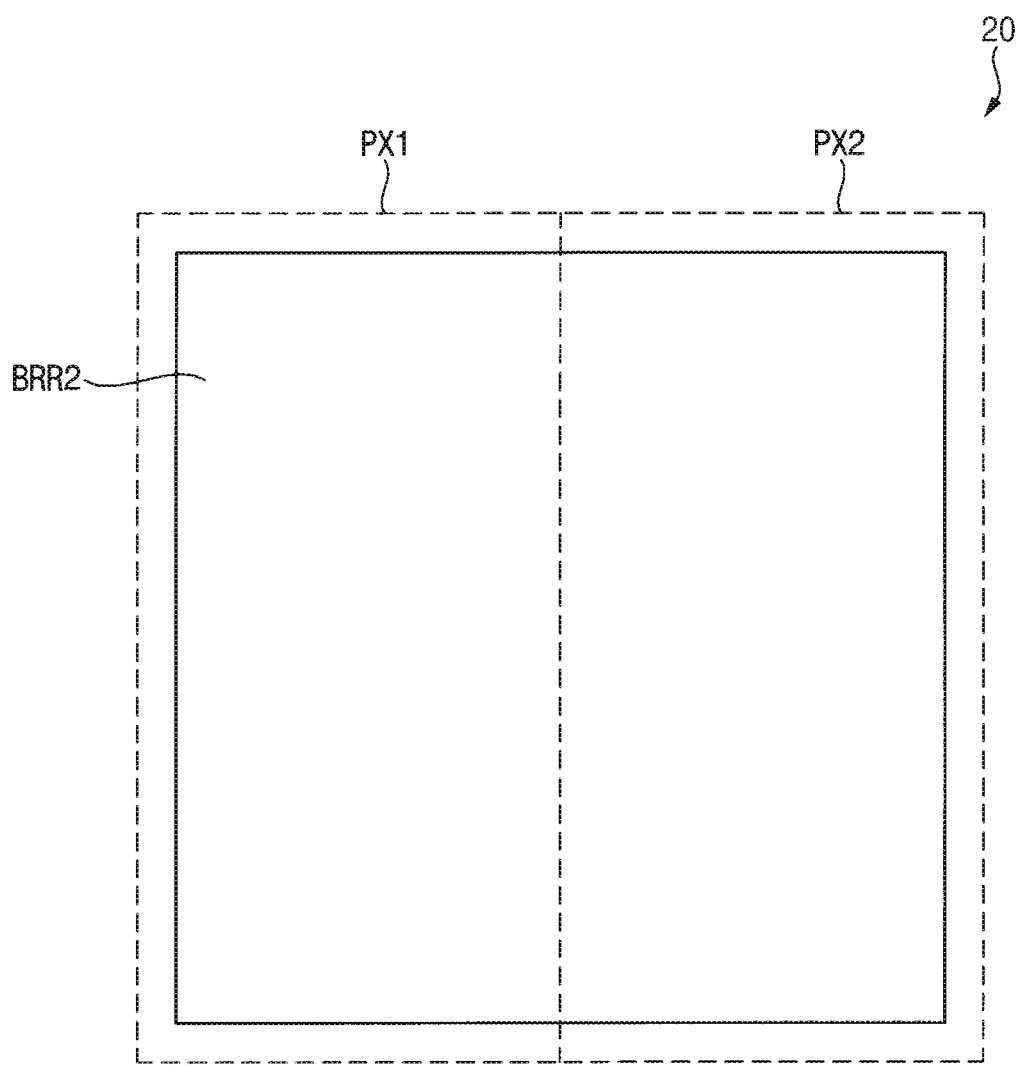

Referring to FIG. 5, a display device 20 according to an embodiment of the present inventive concept may include a first pixel structure PX1 and a second pixel structure PX2 disposed adjacent to the first pixel structure PX1. The second pixel structure PX2 may have a circuit structure substantially the same as a circuit structure of the first pixel structure PX1. In an embodiment, the first pixel structure PX1 and the second pixel structure PX2 may be symmetrical about a line of symmetry which passes through a middle of the first pixel structure PX1 and the second pixel structure PX2.

Referring to FIGS. 6, 7, 8, 9, and 17, the first pixel structure PX1 may include a first organic film layer PI1, a first barrier layer BRR1, a second organic film layer PI2, a second barrier layer BRR2, a shielding pattern SDP, and a third barrier layer BRR3.

The first organic film layer PI1 may include an organic material. For example, the first organic film layer PI1 may include polyimide.

The first barrier layer BRR1 may be disposed on the first organic film layer PI1. The first barrier layer BRR1 may include an inorganic material. For example, the first barrier layer BRR1 may include silicon oxide, silicon nitride, or the like.

The second organic film layer PI2 may be disposed on the first barrier layer BRR1. For example, the second organic film layer PI2 may include the same material as the first organic film layer PI1.

The second barrier layer BRR2 may be disposed on the second organic film layer PI2. The second barrier layer BRR2 may include the same material as the first barrier layer BRR1. For example, at least one of the first organic film layer PI1, the first barrier layer BRR1, the second organic film layer PI2, and the second barrier layer BRR2 may constitute a substrate of the display panel 100.

In an embodiment, the shielding pattern SDP may be disposed between the second organic film layer PI2 and the first active pattern 1100. For example, the shielding pattern SDP may be disposed on the second barrier layer BRR2.

In an embodiment, the shielding pattern SDP may include a silicon semiconductor. For example, the shielding pattern SDP may include amorphous silicon or polycrystalline silicon. In addition, the shielding pattern SDP may be doped with positive ions or negative ions. For example, the positive ions may be a group III element, boron, or the like. The negative ions may be a group V element, phosphorus, or the like.

In an embodiment, a constant voltage (i.e. a DC voltage) may be provided to the shielding pattern SDP. In another embodiment, the shielding pattern SDP may be electrically floating. In another embodiment, an AC voltage may be provided to the shielding pattern SDP.

In an embodiment, the shielding pattern SDP may include a first pattern PTN1 and a second pattern PTN2. The first pattern PTN1 may include a first portion PRT1 and a second portion PRT2. The first pattern PTN1 and the second pattern PTN2 may be symmetrical about a line of symmetry which passes through a middle of the first pattern PTN1 and the second pattern PTN2.

The first portion PRT1 may completely overlap a gate electrode (e.g., a first gate electrode 1221 in FIG. 11) to be described later. For example, a shape of the first portion PRT1 may be substantially the same as a shape of the first gate electrode 1221 and a size of the first portion PRT1 may be greater than or equal to a size of the first gate electrode 1221.

The second portion PRT2 may completely overlap a high power voltage line (e.g., a high power voltage line 1720 in FIG. 16), which will be described later. For example, the second portion PRT2 may be disposed along the high power voltage line 1720 to completely overlap the high power voltage line 1720.

In an embodiment, a third thickness TH3 of the shielding pattern SDP may be set according to a doping concentration of the positive ions or the negative ions doped in the shielding pattern SDP. For example, when the shielding pattern SDP is doped with boron having a concentration of about 10E12, the third thickness TH3 of the shielding pattern SDP may be about 500 angstroms.

Figure 7:
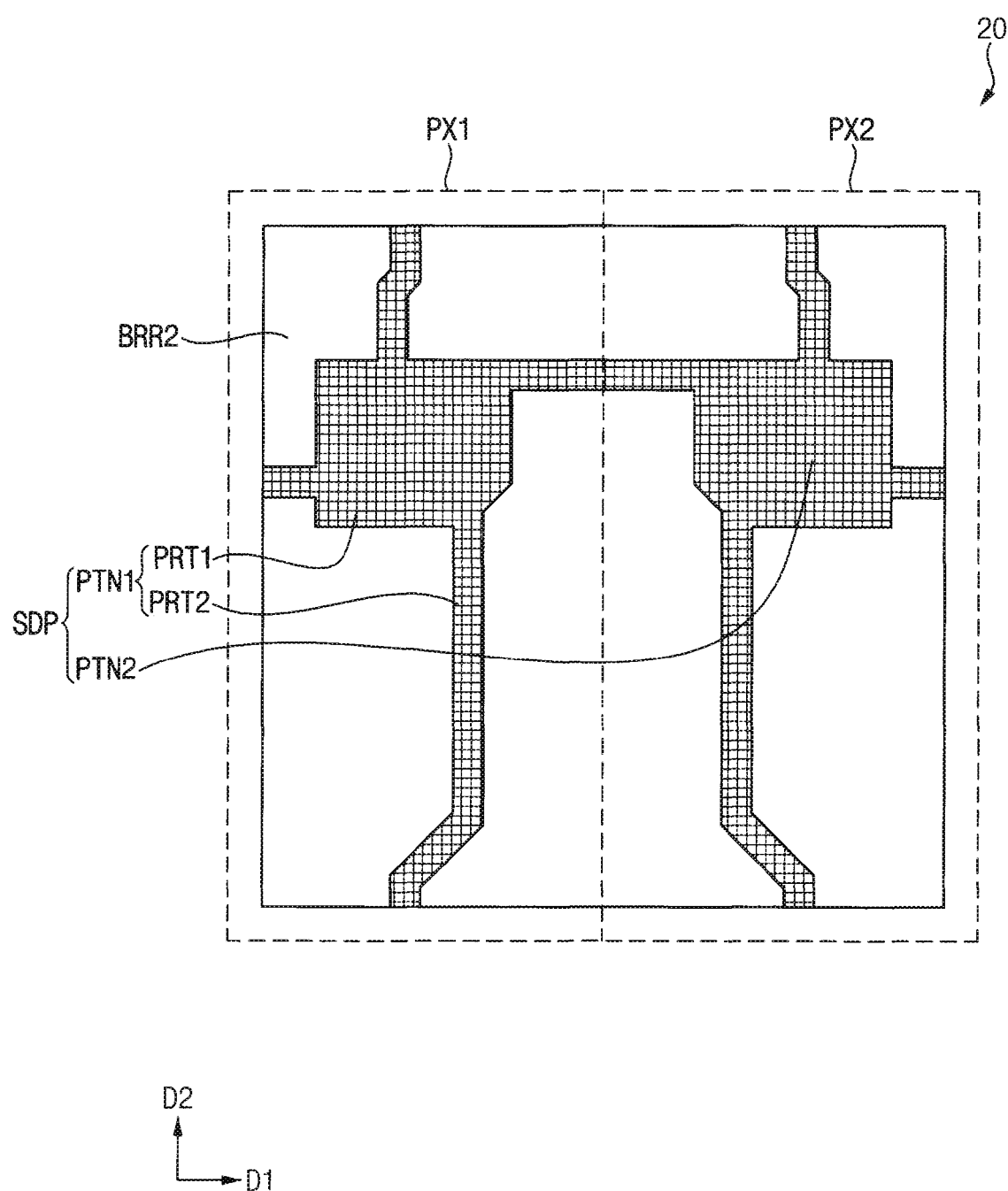
Figure 8:
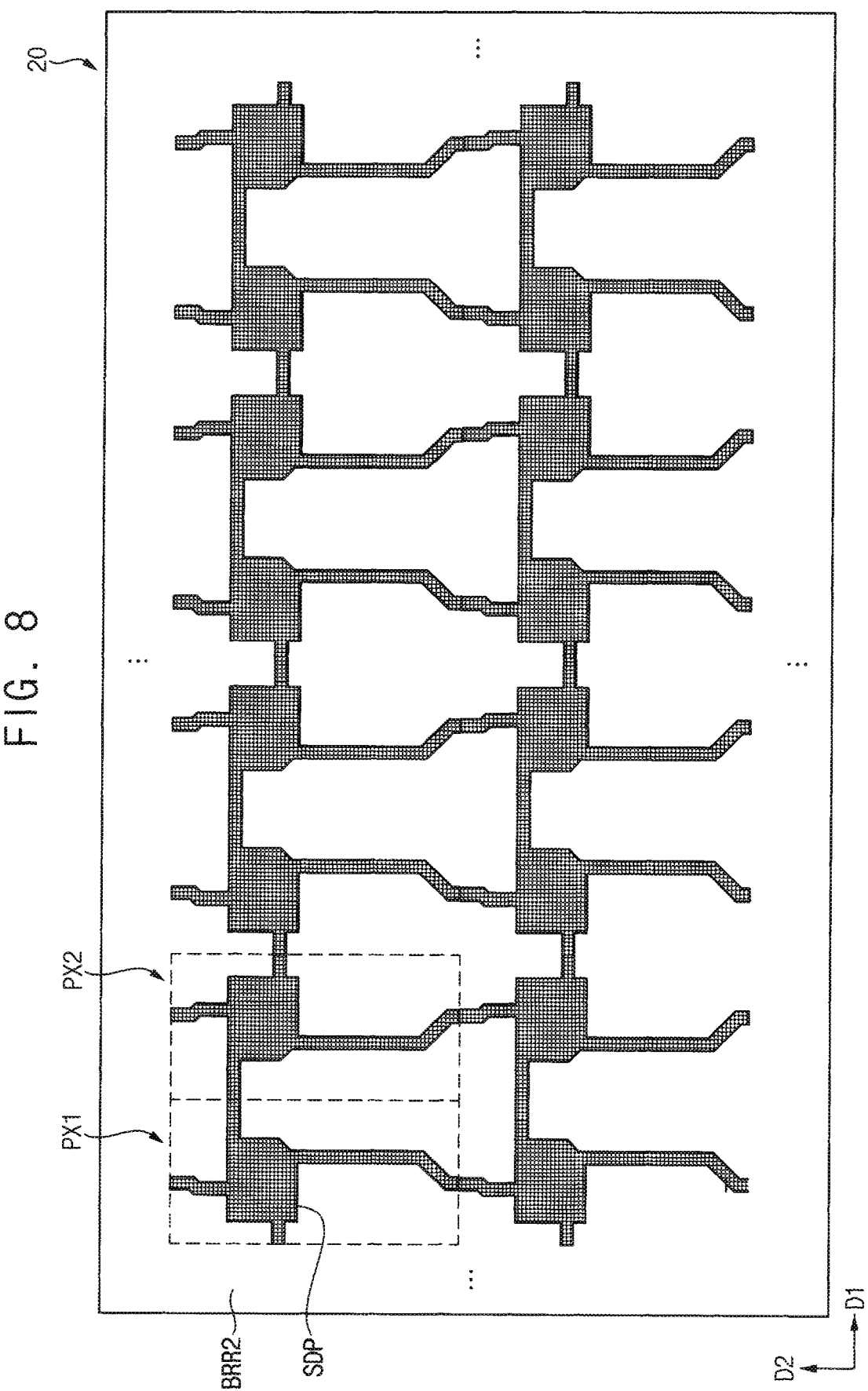
Figure 9:
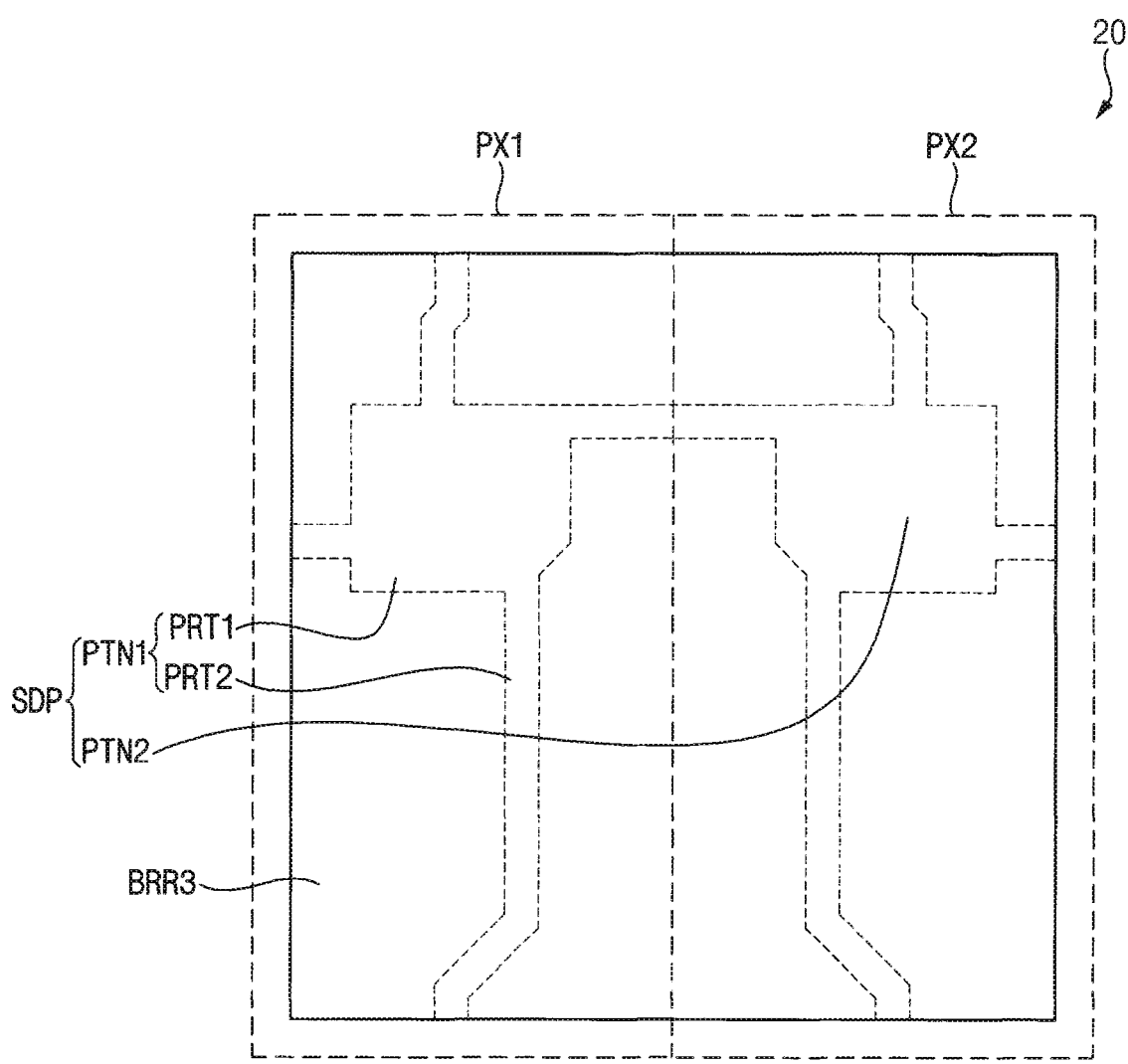

In an embodiment, as shown in FIGS. 7 and 8, the shielding pattern SDP may have a mesh shape. For example, a plurality of shielding patterns may be disposed on the second barrier layer BRR2. The shielding patterns may be repeatedly arranged in a certain unit. As the shielding pattern SDP has the mesh structure, the shielding pattern SDP may effectively suppress the polarization of the organic materials.

The third barrier layer BRR3 may cover the shielding pattern SDP and may be disposed on the second barrier layer BRR2. The third barrier layer BRR3 may include the same material as the first barrier layer BRR1.

In an embodiment, a first thickness TH1 of the first barrier layer BRR1 may be equal to a sum of a second thickness TH2 of the second barrier layer BRR2 and a fourth thickness TH4 of the third barrier layer BRR3. In addition, the second thickness TH2 of the second barrier layer BRR2 may be thinner than the fourth thickness TH4 of the third barrier layer BRR3. For example, the first thickness TH1 of the first barrier layer BRR1 may be about 5000 angstroms, the second thickness TH2 of the second barrier layer BRR2 may be about 500 angstroms, and the fourth thickness TH4 of the third barrier layer BRR3 may be about 4500 angstroms. Accordingly, the third thickness TH3 may be equal to the second thickness TH2.

As the second thickness TH2 of the second barrier layer BRR2 is thinner than the fourth thickness TH4 of the third barrier layer BRR3, a distance between the shielding pattern SDP and the first gate electrode 1221 may be increased relatively. Accordingly, a coupling phenomenon between the shielding pattern SDP and the first gate electrode 1221 may be prevented. In addition, as the second barrier layer BRR2 has a second thickness TH2, the second barrier layer BRR2 may protect the second organic film layer PI2 which may be damaged in the process of forming the shielding pattern SDP.

The buffer layer BFR may be disposed on the third barrier layer BRR3. The buffer layer BFR may prevent metal atoms or impurities from diffusing into the first active pattern. In addition, the buffer layer BFR may control a rate of heat conduction during a crystallization process for forming the first active pattern.

Figure 10:
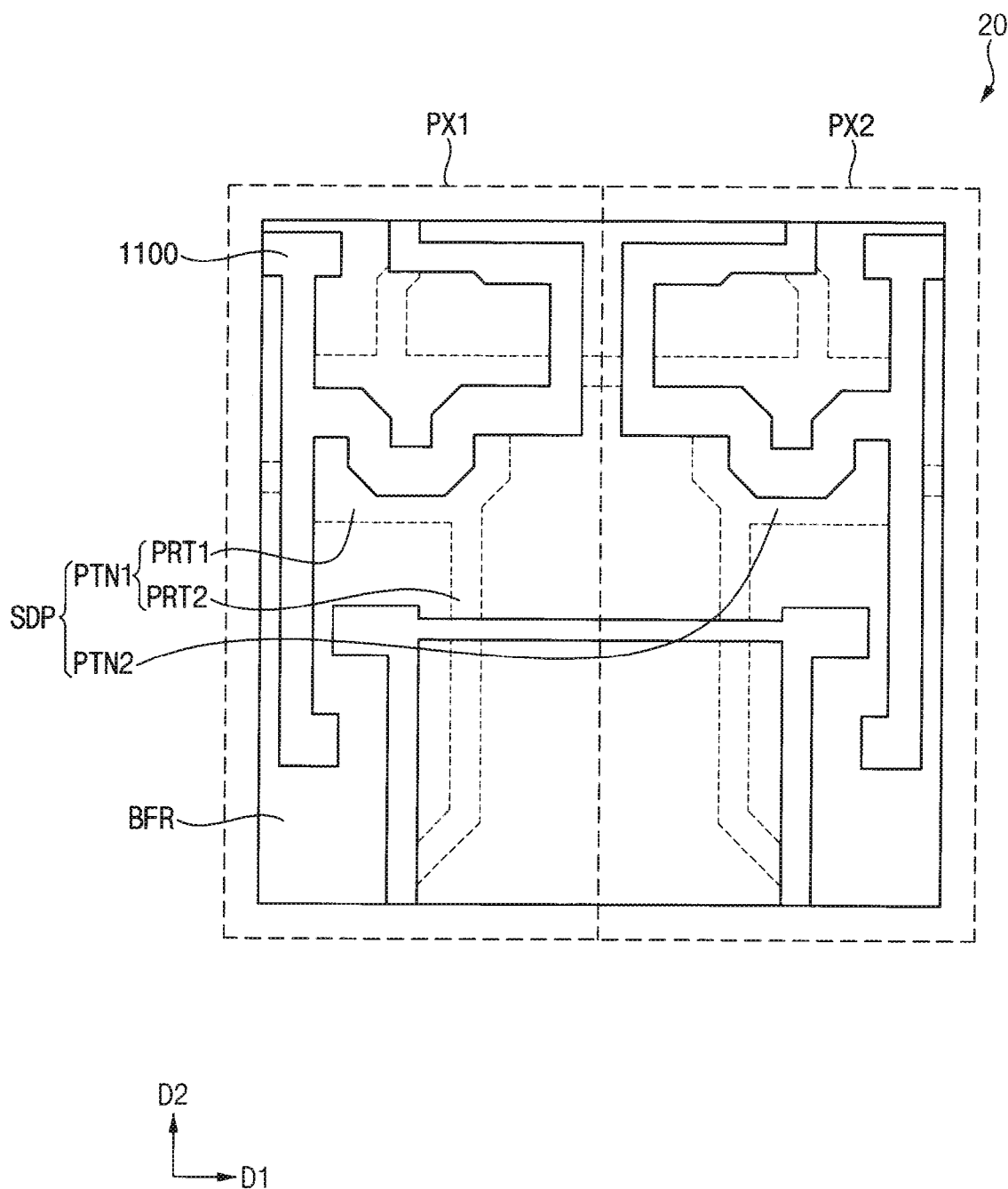

Referring to FIGS. 10 and 17, the first active pattern 1100 may be disposed on the buffer layer BFR. The first active pattern 1100 may overlap the shielding pattern SDP. For example, at least channel forming regions of the active pattern 1100 may be disposed on the shielding pattern SDP. In an embodiment, the first active pattern 1100 may include a silicon semiconductor. For example, the first active pattern 1100 may include amorphous silicon, polycrystalline silicon, or the like.

In an embodiment, positive ions or negative ions may be selectively injected into the first active pattern 1100 except channel regions using the first conductive pattern 1200 which will be described later as a self-aligned mask. For example, when the first, second, fifth, sixth, and seventh transistors T1, T2, T5, T6, and T7 are the PMOS transistors, the first active pattern 1100 may include a source region into which the positive ions are implanted, a drain region into which the positive ions are implanted, and a channel region which is not doped with impurities.

The first gate insulating layer GI1 may cover the first active pattern 1100 and may be disposed on the buffer layer BFR. The first gate insulating layer GI1 may include an insulating material. For example, the first gate insulating layer GI1 may include silicon oxide, silicon nitride, silicon oxynitride, or the like.

Figure 11:
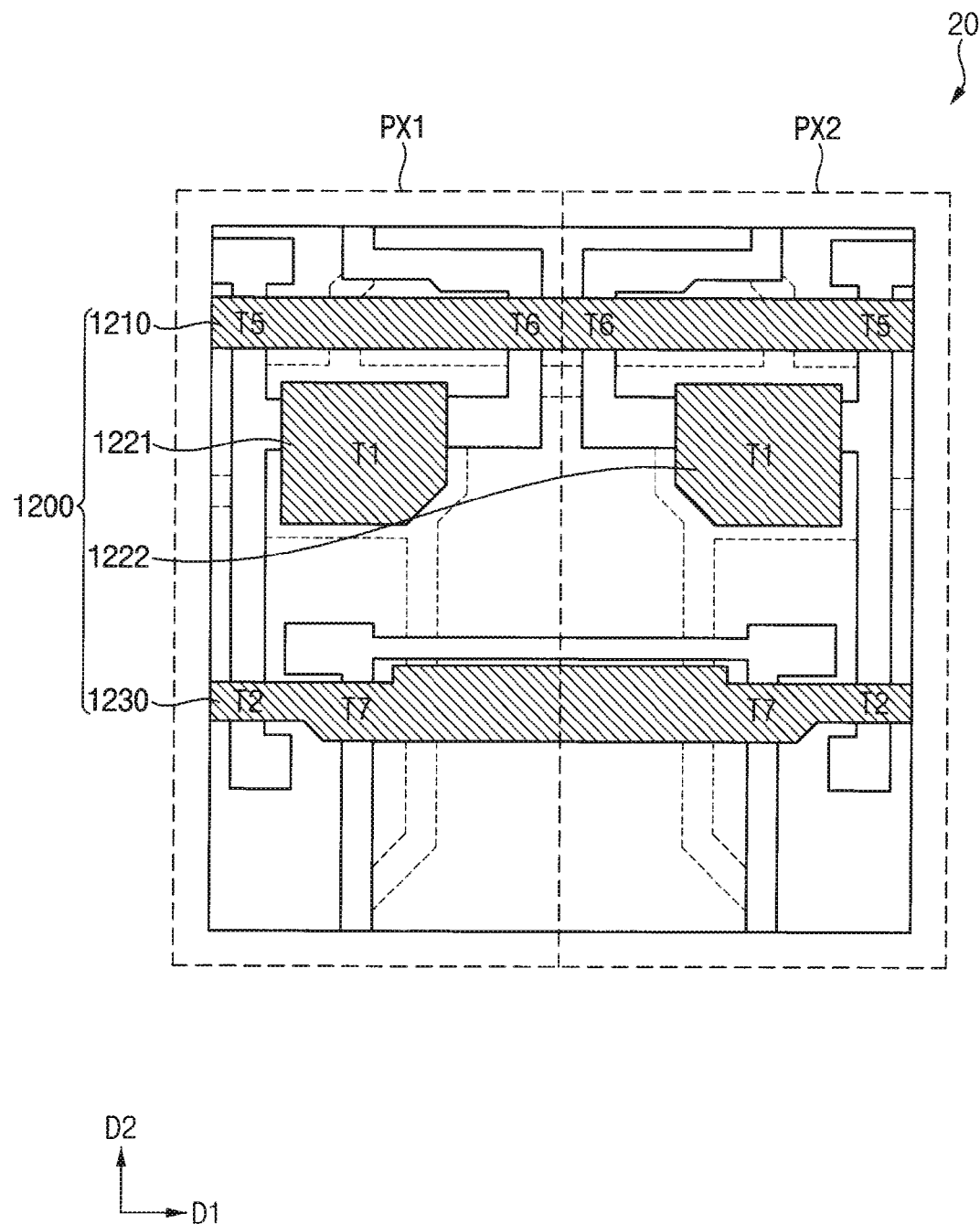

Referring to FIGS. 11 and 17, the first conductive pattern 1200 may be disposed on the first gate insulating layer GI1. The first conductive pattern 1200 may include a first gate line 1210, a first gate electrode 1221, a second gate electrode 1222, and a second gate line 1230.

The first gate line 1210 may be disposed on the first active pattern 1100 and may extend along the first direction D1. In an embodiment, the first gate line 1210 may be disposed adjacent to one side of the first gate electrode 1221 in a plan view. The first gate line 1210 may constitute the fifth and sixth transistors T5 and T6 together with the first active pattern 1100, respectively. The emission control signal EM may be provided to the first gate line 1210. For example, the first gate line 1210 may be referred to as an emission control line.

The first gate electrode 1221 may overlap the first portion PRT1 of the first pattern PTN1 and the first active pattern 1100. The first gate electrode 1221 may constitute the first transistor T1 included in the first pixel structure PX1 together with the first active pattern 1100.

The second gate electrode 1222 may be spaced apart from the first gate electrode 1221 in the first direction D1. The second gate electrode 1222 may overlap the second pattern PTN2 and the first active pattern 1100. The second gate electrode 1222 may constitute the first transistor T1 included in the second pixel structure PX2 together with the first active pattern 1100.

The second gate line 1230 may be disposed on the first active pattern 1100 and may extend along the first direction D1. For example, the second gate line 1230 may constitute the second transistor T2 together with the first active pattern 1100. The first gate signal GW may be provided to the second gate line 1230.

In addition, the second gate line 1230 may constitute the seventh transistor T7 together with the first active pattern 1100. The fourth gate signal GB may be provided to the second gate line 1230. For example, the first gate signal GW and the fourth gate signal GB may have substantially the same waveform.

For example, the first conductive pattern 1200 may include a metal, an alloy, a conductive metal oxide, a transparent conductive material, and the like. For example, the first conductive pattern 1200 may include silver ("Ag"), an alloy containing silver, molybdenum ("Mo"), an alloy containing molybdenum, aluminum ("Al"), an alloy containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide ("IZO"), and the like.

The second gate insulating layer GI2 may cover the first conductive pattern 1200 and may be disposed on the first gate insulating layer GI1. The second gate insulating layer GI2 may include an insulating material.

Meanwhile, the first, second, fifth, sixth, and seventh transistors T1, T2, T5, T6, and T7 may substantially correspond to the first, second, fifth, sixth, and seventh transistors T1, T2, T5, T6, and T7 described with reference to FIG. 3. For example, the first gate electrode 1221 may correspond to the gate terminal of the first transistor T1 described with reference to FIG. 3. However, the above-described correspondence will be apparent to those skilled in the art.

Figure 12:
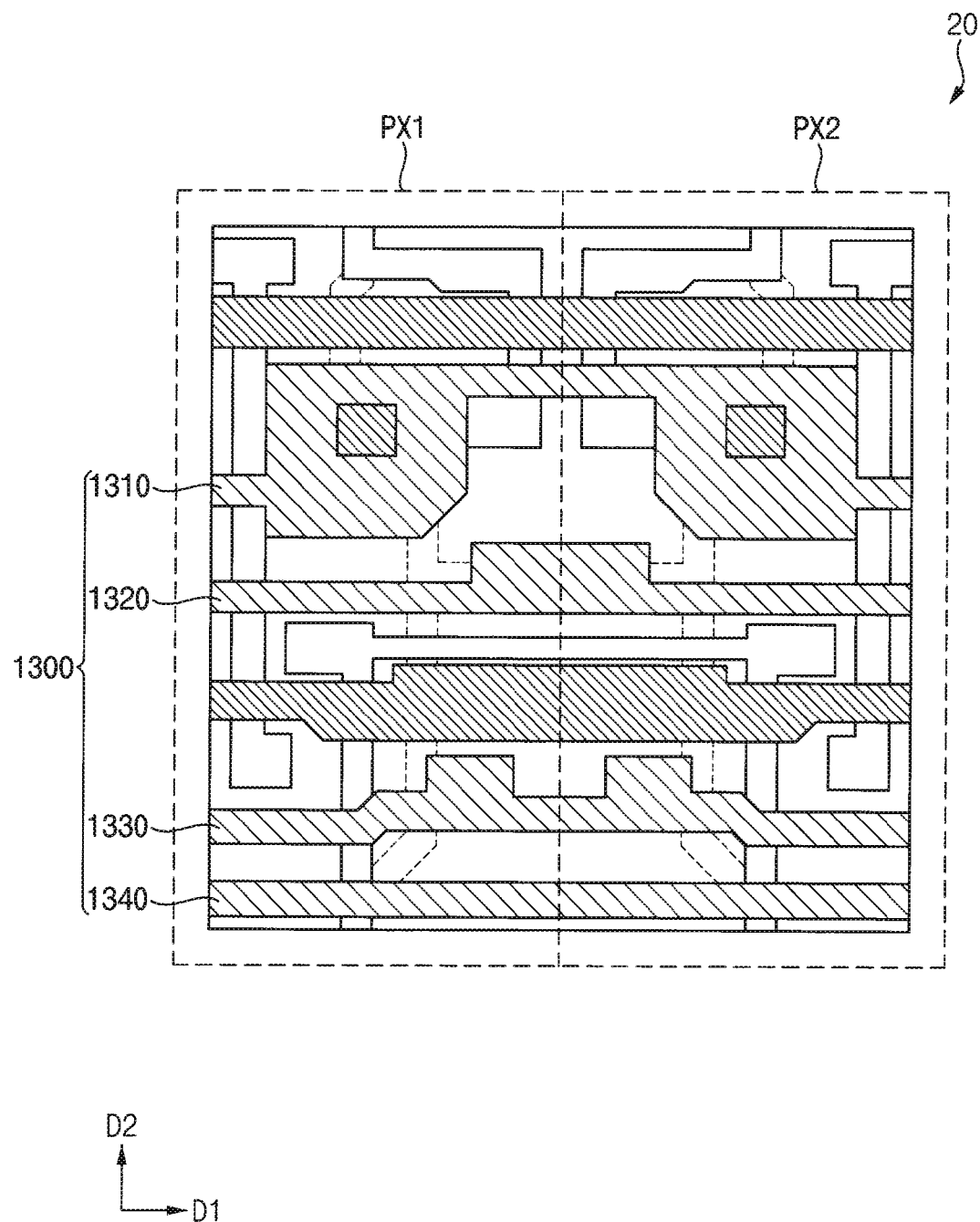

Referring to FIGS. 12 and 17, a second conductive pattern 1300 may be disposed on the second gate insulating layer GI2. The second conductive pattern 1300 may include a storage capacitor electrode 1310, a third gate line 1320, a fourth gate line 1330, and a gate initialization voltage line 1340.

The storage capacitor electrode 1310 may extend along the first direction D1. In an embodiment, the storage capacitor electrode 1310 may constitute the storage capacitor CST included in the first pixel structure PX1 together with the first gate electrode 1221. For example, the storage capacitor electrode 1310 may overlap the first gate electrode 1221 and the high power voltage ELVDD may be provided to the storage capacitor electrode 1310. In addition, the storage capacitor electrode 1310 may constitute the storage capacitor CST included in the second pixel structure PX2 together with the second gate electrode 1222. For example, the storage capacitor electrode 1310 may overlap the second gate electrode 1222.

In an embodiment, openings exposing top surfaces of the first and second gate electrodes 1221 and 1222 may be formed in the storage capacitor electrode 1310.

The third gate line 1320 may extend along the first direction D1. In an embodiment, the third gate line 1320 may be disposed adjacent to the other side opposite to the one side of the first gate electrode 1221 in a plan view. In an embodiment, the third gate line 1320 may provide the second gate signal GC to the third transistor T3. For example, the third gate line 1320 may correspond to the lower gate terminal of the third transistor T3. The third gate line 1320 may be referred to as a lower compensation control line.

The fourth gate line 1330 may extend along the first direction D1. In an embodiment, the fourth gate line 1330 may provide the third gate signal GI to the fourth transistor T4. For example, the fourth gate line 1330 may correspond to the lower gate terminal of the fourth transistor T4.

The gate initialization voltage line 1340 may extend along the first direction D1. In an embodiment, the gate initialization voltage line 1340 may provide the gate initialization voltage VINT to the fourth transistor T4. For example, the gate initialization voltage line 1340 may be electrically connected to a second active pattern (e.g., a second active pattern 1400 in FIG. 13) to be described later.

For example, the second conductive pattern 1300 may include a metal, an alloy, a conductive metal oxide, a transparent conductive material, and the like.

A first interlayer insulating layer ILD1 may cover the second conductive pattern 1300 and may be disposed on the second gate insulating layer GI2. The first interlayer insulating layer ILD1 may include an insulating material.

Figure 13:
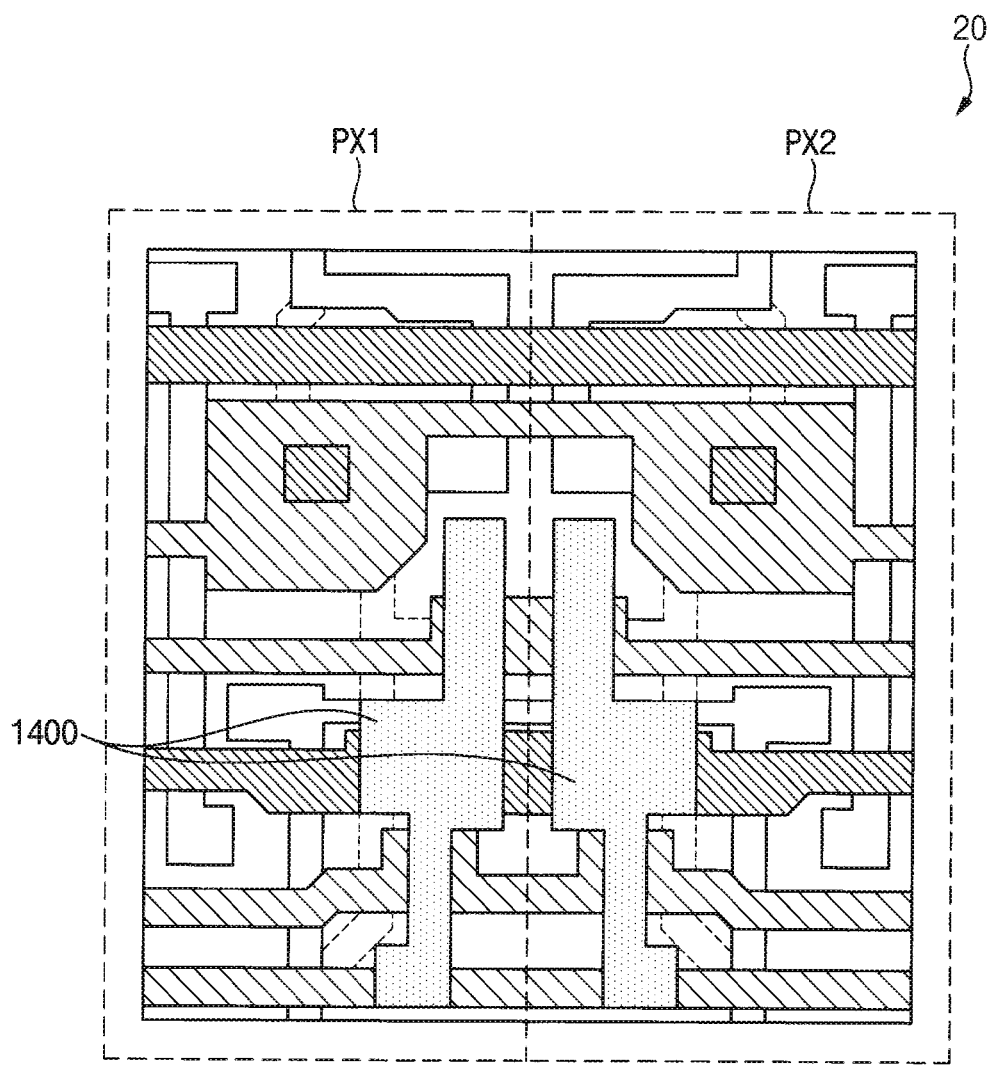

Referring to FIGS. 13 and 17, a second active pattern 1400 may be disposed on the first interlayer insulating layer ILD1. For example, the second active pattern 1400 may overlap the third gate line 1320, the fourth gate line 1330, and the gate initialization voltage line 1340.

In an embodiment, the second active pattern 1400 may be disposed on a different layer from the first active pattern 1100. In other words, the second active pattern 1400 may be formed separately from the first active pattern 1100. For example, the first active pattern 1100 may include the silicon semiconductor and the second active pattern 1400 may include an oxide semiconductor.

In an embodiment, the first pixel structure PX1 may include the first, second, fifth, sixth, and seventh transistors T1, T2, T5, T6, and T7 which are silicon-based transistors and the third and fourth transistors T3 and T4 which are oxide-based transistors. For example, the first, second, fifth, sixth, and seventh transistors T1, T2, T5, T6, and T7 may be the PMOS transistors and the third and fourth transistors T3 and T4 may be the NMOS transistors.

The third gate insulating layer GI3 may cover the second active pattern 1400 and may be disposed on the first interlayer insulating layer ILD1. The third gate insulating layer GI3 may include an insulating material.

Figure 14:
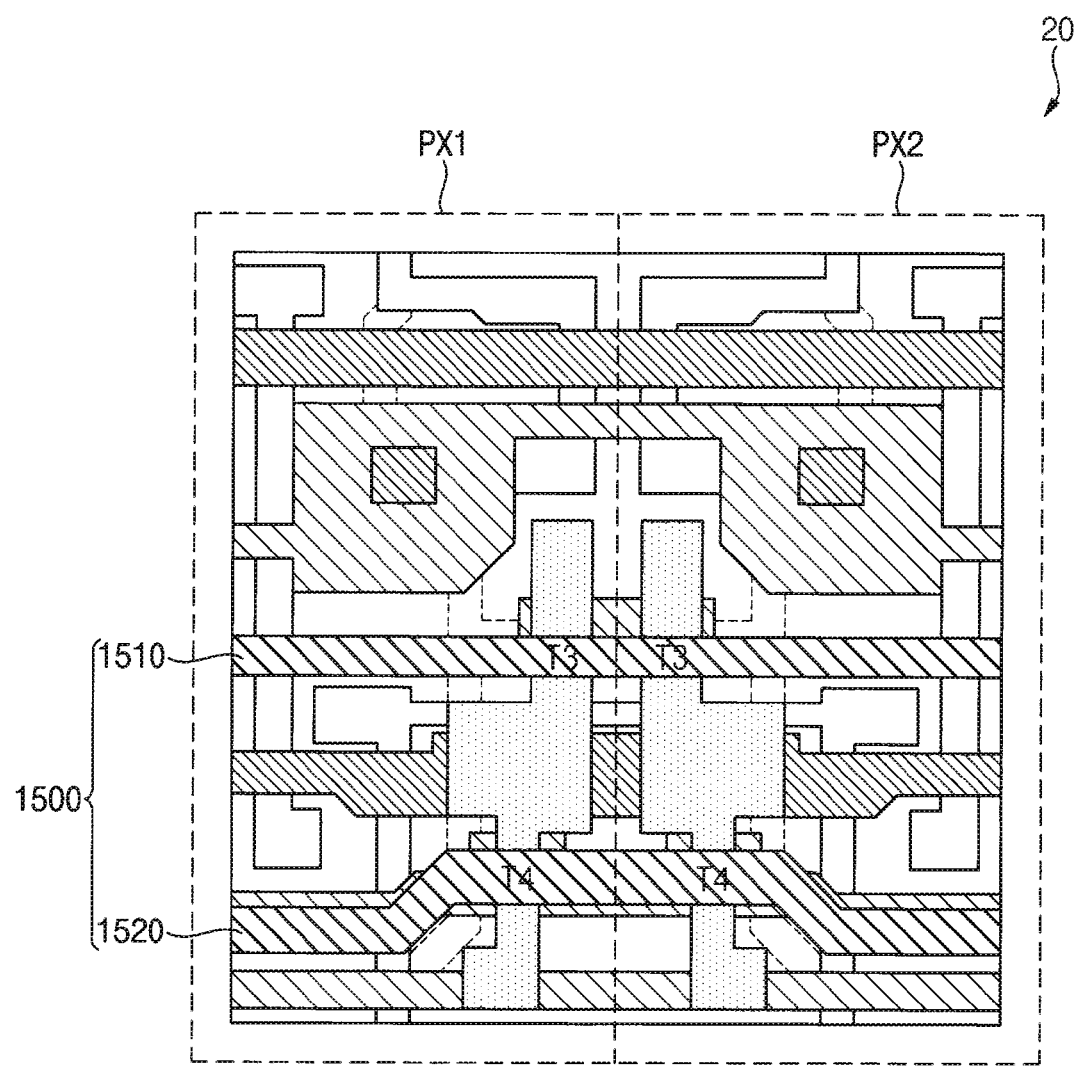

Referring to FIGS. 14 and 17, a third conductive pattern 1500 may be disposed on the third gate insulating layer GI3. The third conductive pattern 1500 may include a fifth gate line 1510 and a sixth gate line 1520.

The fifth gate line 1510 may extend along the first direction D1. For example, the fifth gate line 1510 may overlap the third gate line 1320, and the fifth gate line 1510 may be electrically connected to the third gate line 1320. In an embodiment, the fifth gate line 1510 may provide the second gate signal GC to the third transistor T3. Accordingly, the fifth gate line 1510 may correspond to the gate terminal of the third transistor T3. The fifth gate line 1510 may be referred to as an upper compensation control line.

The sixth gate line 1520 may extend along the first direction D1. For example, the sixth gate line 1520 may overlap the fourth gate line 1330 and may be electrically connected to the fourth gate line 1330. In an embodiment, the sixth gate line 1520 may provide the third gate signal GI to the fourth transistor T4. Accordingly, the sixth gate line 1520 may correspond to the gate terminal of the fourth transistor T4.

The second interlayer insulating layer ILD2 may cover the third conductive pattern 1500 and may be disposed on the first interlayer insulating layer ILD1. The second interlayer insulating layer ILD2 may include an insulating material.

Figure 15:
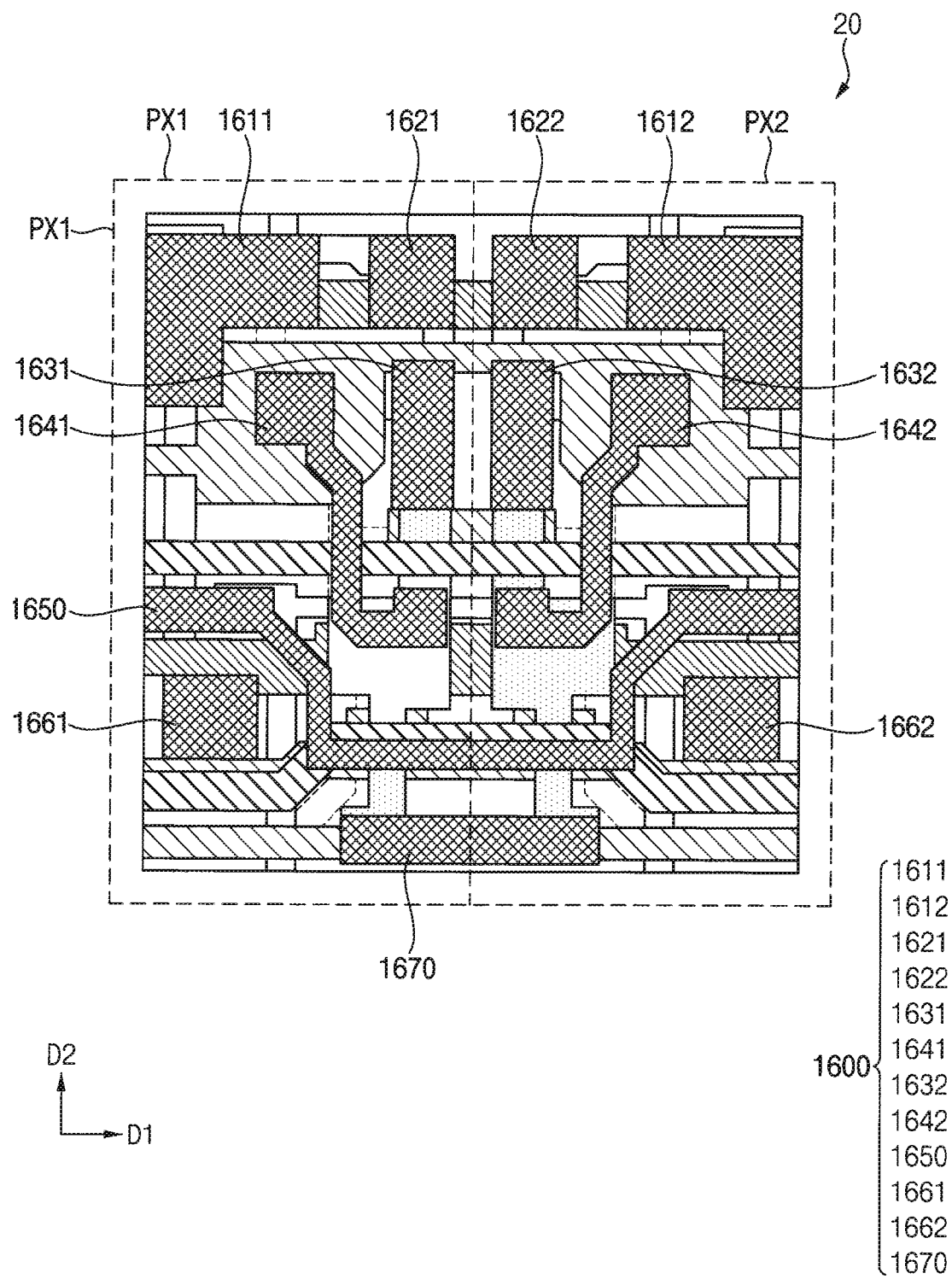

Referring to FIGS. 15 and 17, a fourth conductive pattern 1600 may be disposed on the second interlayer insulating layer ILD2. The fourth conductive pattern 1600 may include a first high power voltage pattern 1611, a second high power voltage pattern 1612, a first anode pattern 1621, a second anode pattern 1622, a first compensation connection pattern 1631, a second compensation connection pattern 1632, a first initialization connection pattern 1641, a second initialization connection pattern 1642, an anode initialization voltage line 1650, a first data pattern 1661, and a second data pattern 1662, and a gate initialization voltage pattern 1670.

The first and second high power voltage patterns 1611 and 1612 may transmit the high power voltage EVLDD to the first active pattern 1100. In an embodiment, the first and second high power voltage patterns 1611 and 1612 may electrically connect a high power voltage line (e.g., a high power voltage line 1720 in FIG. 16) and the first active pattern 1100. For example, the first and second high power voltage patterns 1611 and 1612 may contact the high power voltage line 1720 and the first active pattern 1100.

The first anode pattern 1621 may provide the anode initialization voltage AINT or the driving current to the organic light emitting diode OLED included in the first pixel structure PX1. For example, the first anode pattern 1621 may contact the first active pattern 1100 and a third anode pattern (e.g., a third anode pattern 1731 in FIG. 16).

The second anode pattern 1622 may provide the anode initialization voltage AINT or the driving current to the organic light emitting diode OLED included in the second pixel structure PX2. For example, the second anode pattern 1622 may contact the first active pattern 1100 and a fourth anode pattern (e.g., a fourth anode pattern 1732 of FIG. 16).

The first compensation connection pattern 1631 may electrically connect the second terminal of the first transistor T1 and the second terminal of the third transistor T3 included in the first pixel structure PX1. For example, the first compensation connection pattern 1631 may contact the first active pattern 1100 and the second active pattern 1400.

The second compensation connection pattern 1632 may electrically connect the second terminal of the first transistor T1 and the second terminal of the third transistor T3 included in the second pixel structure PX2. For example, the second compensation connection pattern 1632 may contact the first active pattern 1100 and the second active pattern 1400.

The first initialization connection pattern 1641 may electrically connect the gate terminal of the first transistor T1 and the second terminal of the fourth transistor T4 included in the first pixel structure PX1. For example, the first initialization connection pattern 1641 may contact the second active pattern 1400 and the first gate electrode 1221.

The second initialization connection pattern 1642 may electrically connect the gate terminal of the first transistor T1 and the second terminal of the fourth transistor T4 included in the second pixel structure PX2. For example, the second initialization connection pattern 1642 may contact the second active pattern 1400 and the second gate electrode 1222.

The anode initialization voltage line 1650 may provide the anode initialization voltage AINT to the seventh transistor T7. For example, the anode initialization voltage line 1650 may contact the first active pattern 1100.

The first data pattern 1661 may provide the data voltage DATA to the second transistor T2 included in the first pixel structure PX1. For example, the first data pattern 1661 may contact the first active pattern 1100 and a first data line (e.g., a first data line 1711 in FIG. 16).

The second data pattern 1662 may provide the data voltage DATA to the second transistor T2 included in the second pixel structure PX2. For example, the second data pattern 1662 may contact the first active pattern 1100 and a second data line (e.g., a second data line 1712 in FIG. 16).

The gate initialization voltage pattern 1670 may provide the gate initialization voltage VINT to the fourth transistor T4. For example, the gate initialization voltage pattern 1670 may provide the gate initialization voltage VINT to the second active pattern 1400. The gate initialization voltage pattern 1670 may contact the gate initialization voltage line 1340 and the second active pattern 1400.

The first via insulating layer VIA1 may cover the fourth conductive pattern 1600 and may be disposed on the second interlayer insulating layer ILD2. The first via insulating layer VIA1 may include an organic insulating material. For example, the first via insulating layer VIA1 may include a photoresist, a polyacrylic resin, a polyimide resin, an acrylic resin, or the like.

Figure 16:
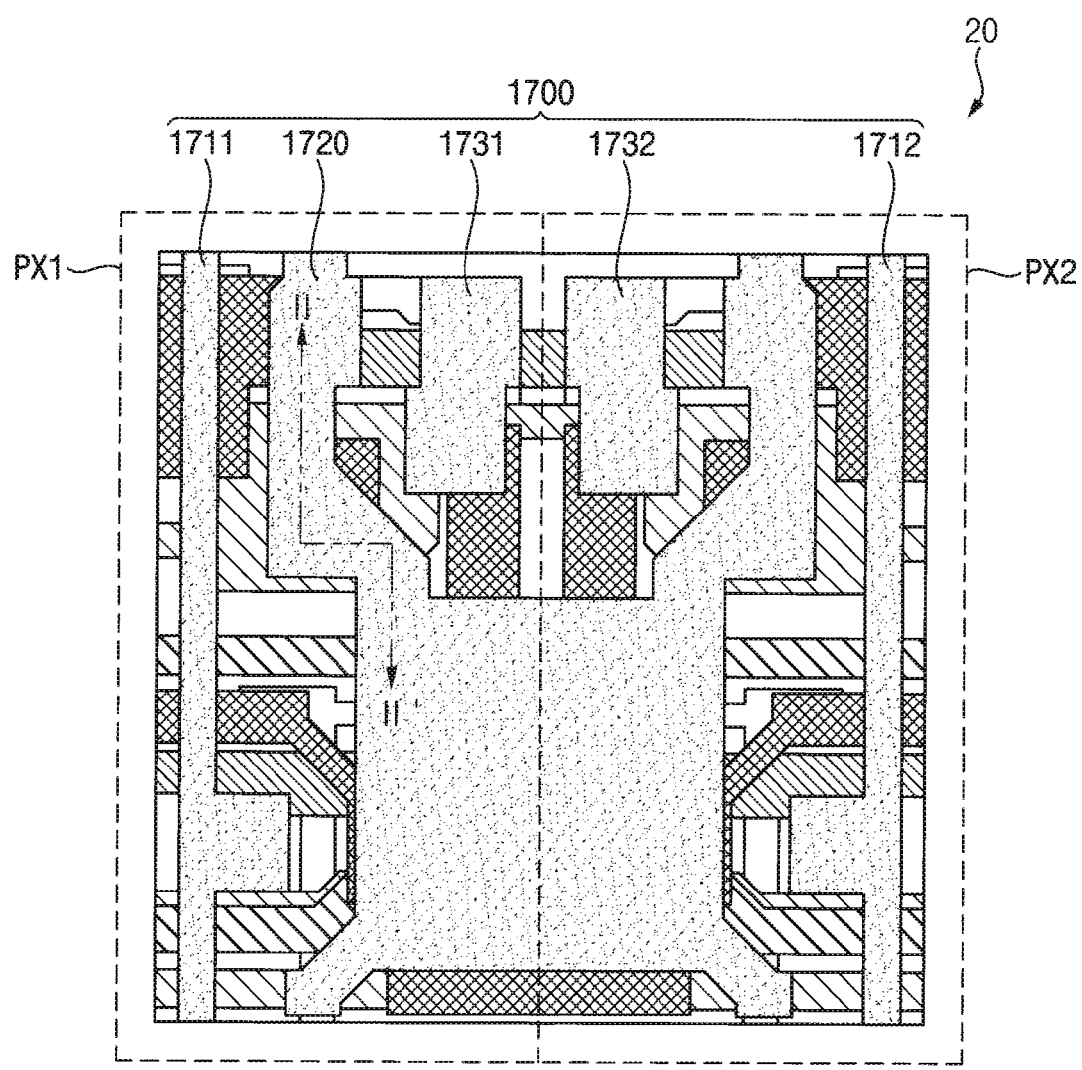
Figure 17:
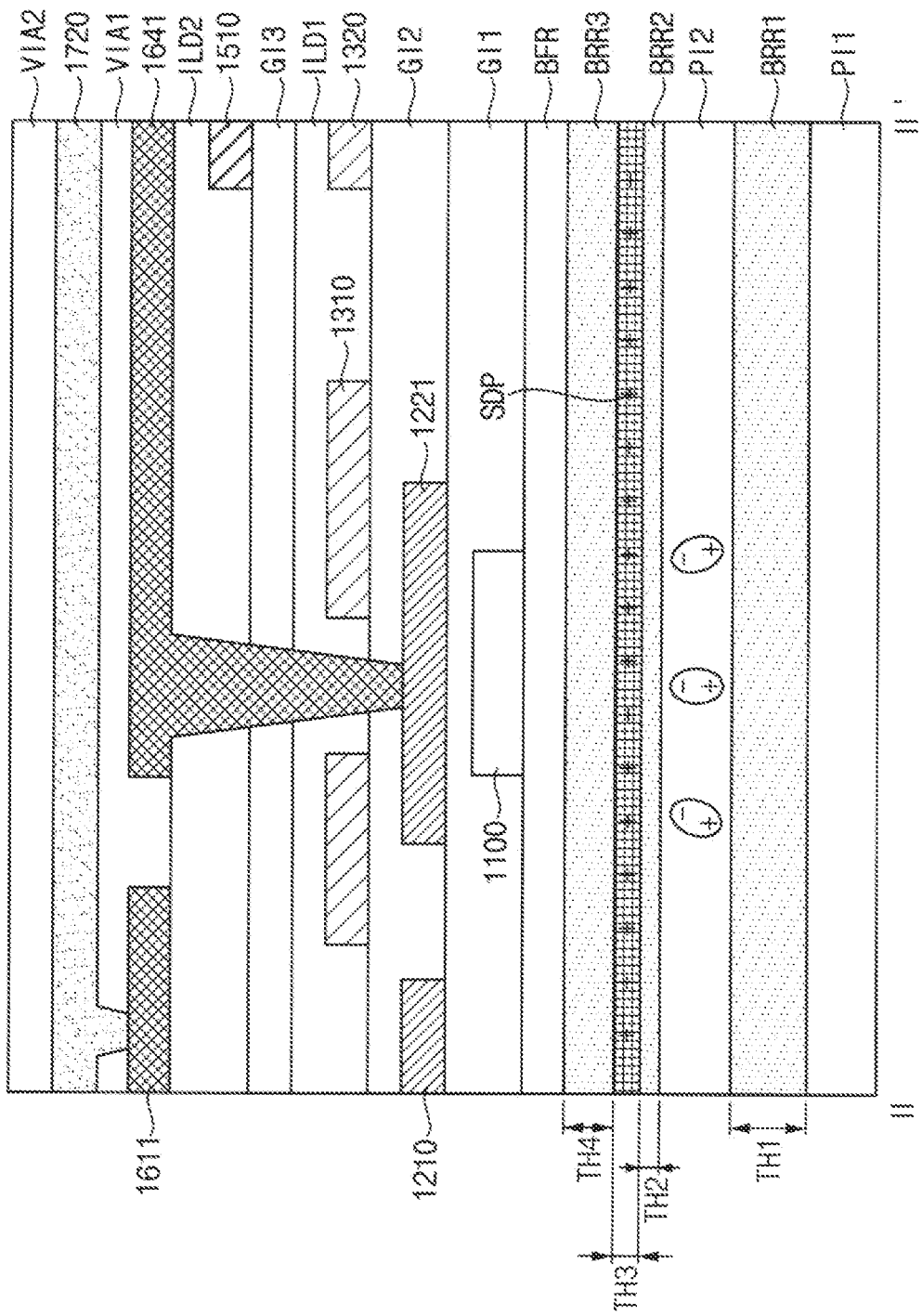
FIG. 17 is a cross-sectional view illustrating an example taken along line II-II' of FIG. 16.
Figure 18:
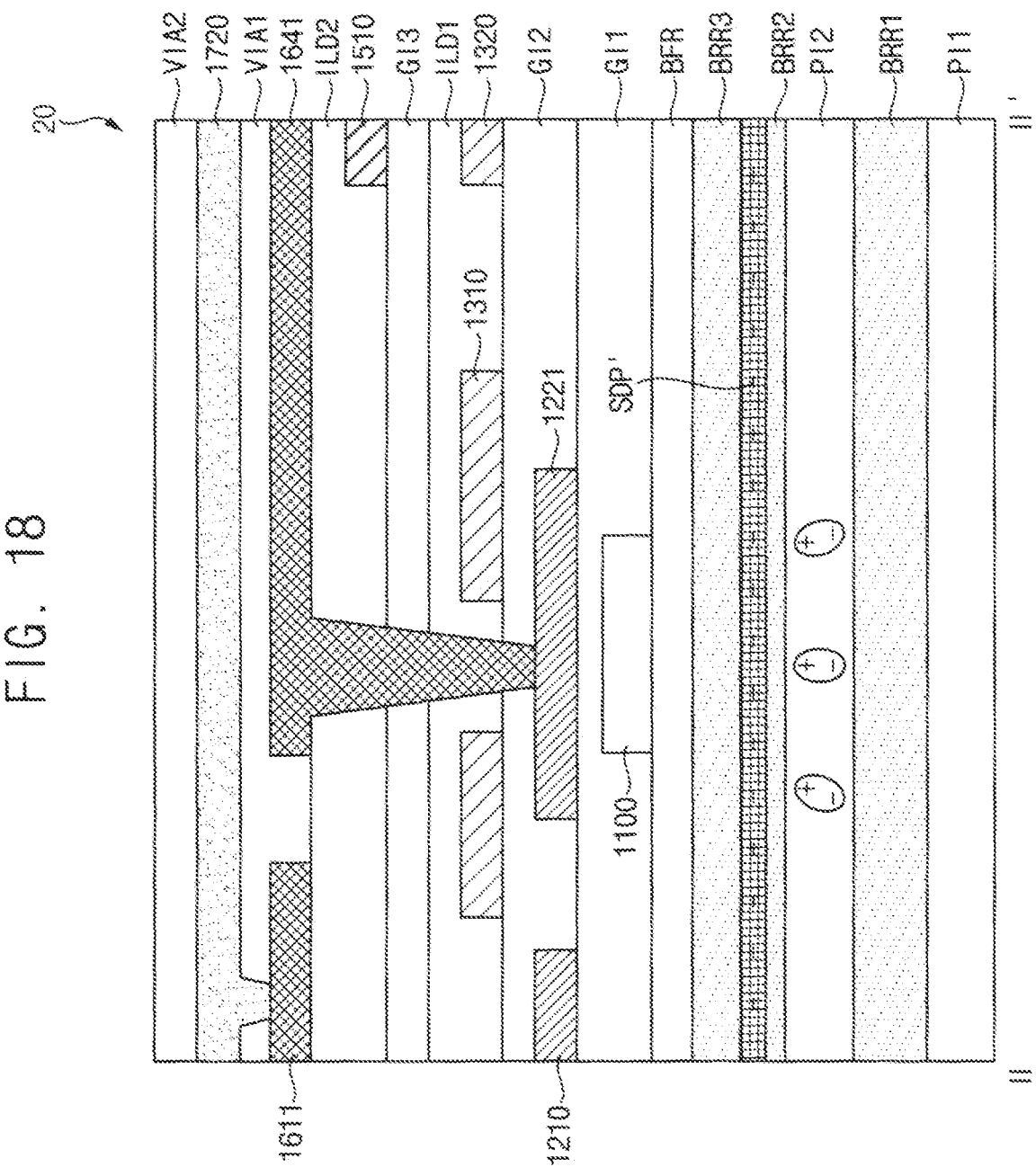
FIG. 18 is a cross-sectional view illustrating another example taken along line II-II' of FIG. 16.

Referring to FIGS. 16 and 17, a fifth conductive pattern 1700 may be disposed on the first via insulating layer VIA1. The fifth conductive pattern 1700 may include a first data line 1711, a second data line 1712, a high power voltage line 1720, a third anode pattern 1731, and a fourth anode pattern 1732.

The first data line 1711 may extend along the second direction D2. In an embodiment, the first data line 1711 may provide the data voltage DATA to the second transistor 72 included in the first pixel structure PX1. For example, the first data line 1711 may contact the first data pattern 1661.

The second data line 1712 may extend along the second direction D2. In an embodiment, the second data line 1712 may provide the data voltage DATA to the second transistor T2 included in the second pixel structure PX2. For example, the second data line 1712 may contact the second data pattern 1662.

The high power voltage line 1720 may extend along the second direction D2. In an embodiment, the high power voltage line 1720 may provide the high power voltage ELVDD to the first and second high power voltage patterns 1611 and 1612. For example, the high power voltage line 1720 may contact the first and second high power voltage patterns 1611 and 1612.

The third anode pattern 1731 may provide the anode initialization voltage AINT or the driving current to the organic light emitting diode OLED included in the first pixel structure PX1. For example, the third anode pattern 1731 may contact the first anode pattern 1621.

The fourth anode pattern 1732 may provide the anode initialization voltage AINT or the driving current to the organic light emitting diode OLED included in the second pixel structure PX2. For example, the fourth anode pattern 1732 may contact the second anode pattern 1622.

The second via insulating layer VIA2 may cover the fifth conductive pattern 1700 and may be disposed on the first via insulating layer VIA1. The second via insulating layer VIA2 may include an organic insulating material. For example, the second via insulating layer VIA2 may include a photoresist, a polyacrylic resin, a polyimide resin, an acrylic resin, or the like.

Referring to FIG. 17, the shielding pattern SDP may overlap the first active pattern 1100, the first gate electrode 1221, and the high power voltage line 1720. The first gate line 1210 may be disposed adjacent to the one side of the first gate electrode 1221, and the third gate line 1320 and the fifth gate line 1510 may be disposed adjacent to the other side of the first gate electrode 1221 in a plan view. In addition, positive ions may be doped in the shielding pattern SDP.

As described above, the emission control signal EM may be provided to the first gate line 1210 and the second gate signal GC may be provided to the third gate line 1320 and the fifth gate line 1510. In order to turn on the fifth and sixth transistors T5 and T6, the emission control signal EM may have a negative voltage level. At the same time, in order to turn off the third transistor T3, the second gate signal GC may have a negative voltage level.

In a conventional display device, as the emission control signal EM and the second gate signal GC have the same negative voltage level at the same time, an electric field may be formed in the second organic film layer PI2. Accordingly, organic materials in the second organic film layer PI2 may be polarized. A back channel may be formed in the first active pattern 1100 by the polarized organic materials. Accordingly, electrical characteristics (e.g., threshold voltage, electron mobility, etc.) of the first transistor T1 may be changed. Accordingly, the first and second pixel structures including the first transistor T1 whose electrical characteristics are changed may emit luminance not corresponding to the data voltage DATA, and display quality of the display device may be deteriorated.

However, the display device 20 may include the shielding pattern SDP disposed between the second organic film layer PI2 and the first active pattern 1100. The shielding pattern SDP may shield the first active pattern 1100 from the polarized organic materials. Accordingly, the back channel may not be formed in the first active pattern 1100 and electrical characteristics of the first transistor T1 may not be changed. Accordingly, the display quality of the display device 20 may be improved.

In addition, the shielding pattern SDP may have a mesh structure. For example, the shielding patterns SDP may be connected to each other, and may be repeatedly arranged in a certain unit. As the shielding pattern SDP has the mesh structure, the shielding pattern SDP may effectively suppress the polarization of the organic materials.

Meanwhile, the polarization phenomenon of the organic materials may be further accelerated by the light incident on the display panel 100 described with reference to FIG. 4 (e.g., the light 11 or the light 12 in FIG. 4). Accordingly, in an embodiment, the shielding pattern SDP may overlap the fingerprint recognition area FA and may not overlap the display area DA. In other words, the shielding pattern SDP may be formed only in the display panel 100 overlapping the fingerprint recognition area FA and may not be formed in the display panel 100 not overlapping the fingerprint recognition area FA.

Referring to FIG. 18, negative ions may be doped in the shielding pattern SDP'.

Figure 19:
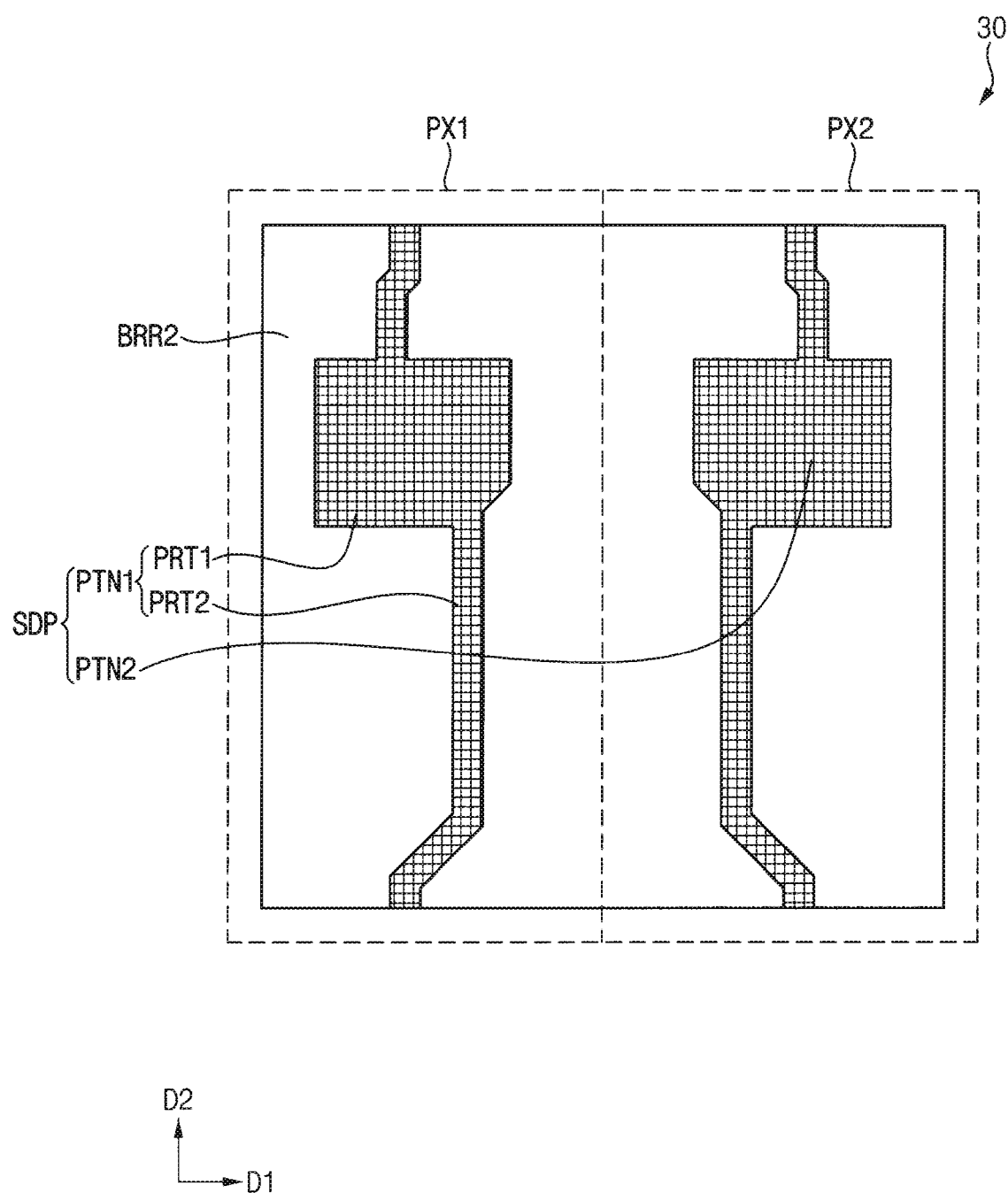
FIGS. 19, 20, 21 and 22 are layout diagrams illustrating a display device according to another embodiment.
Figure 20:
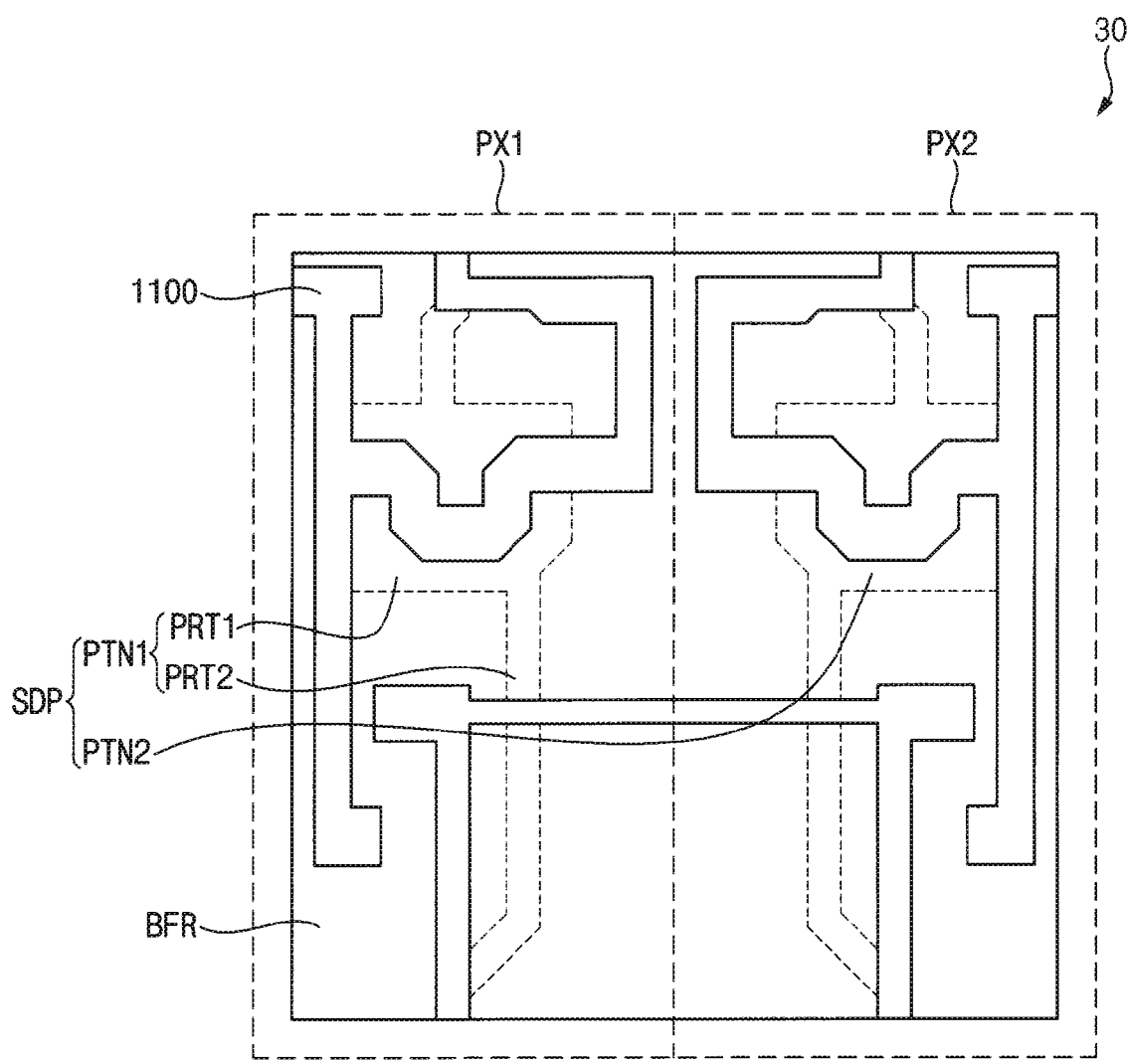
Figure 21:
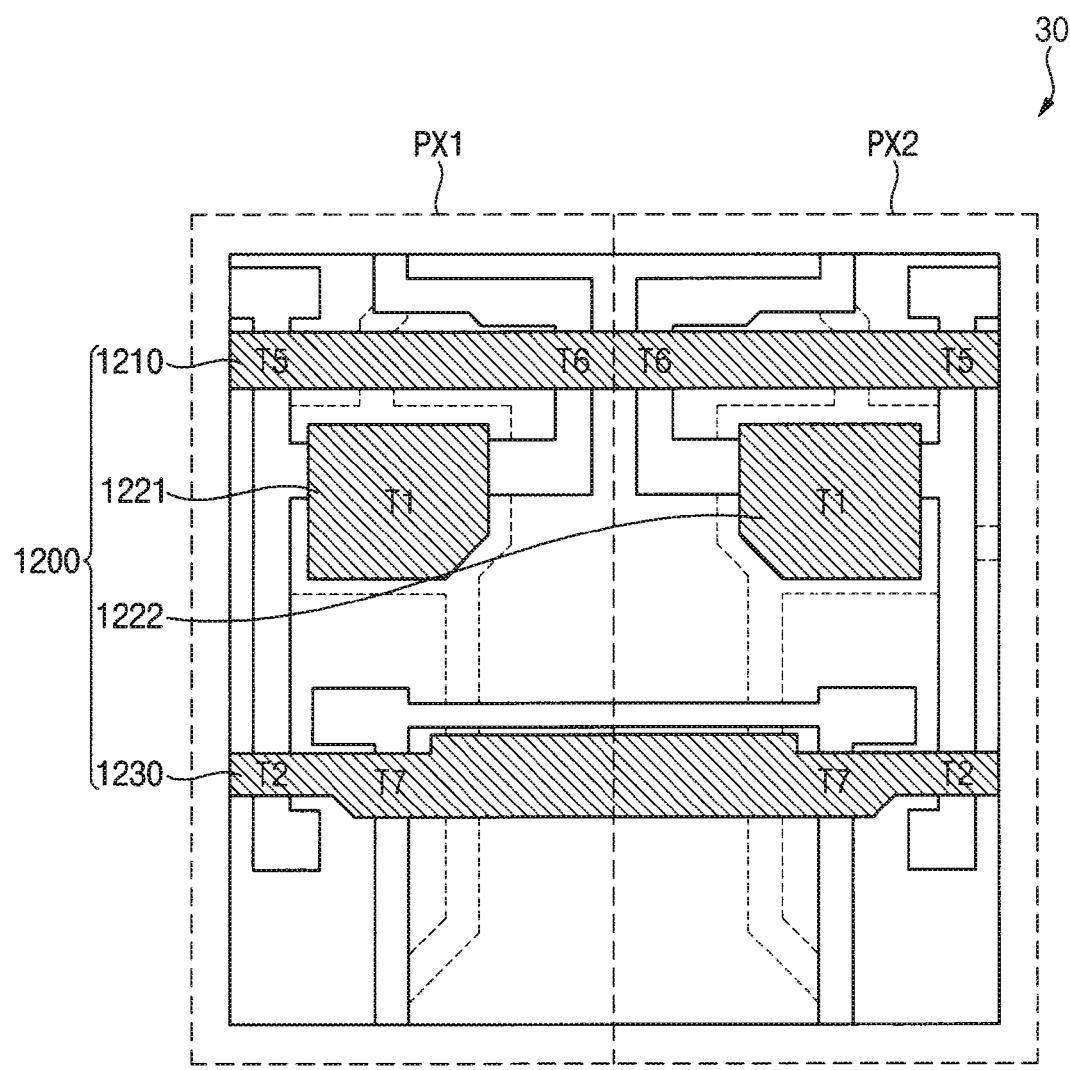
Figure 22:
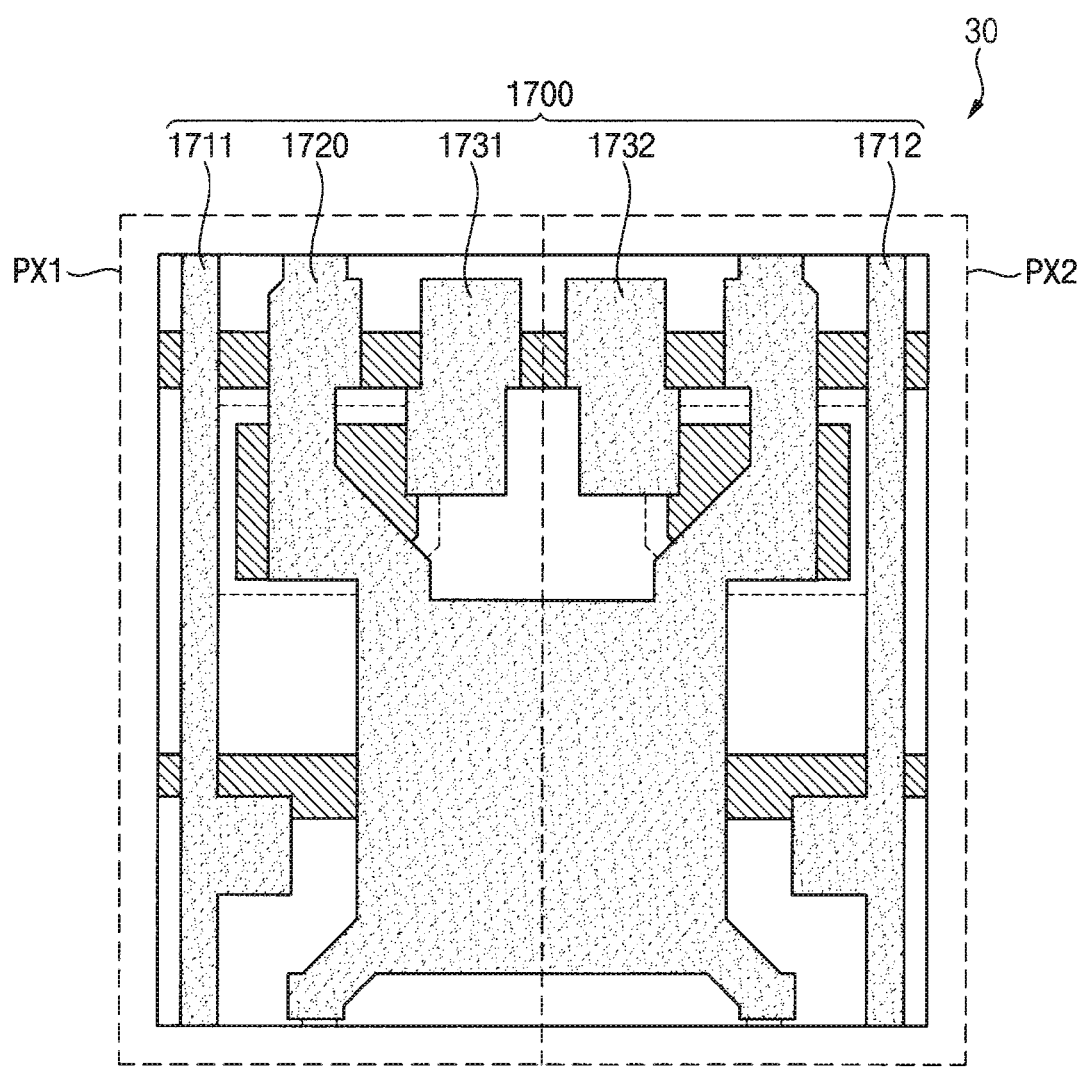

FIGS. 19 to 22 are layout diagrams illustrating a display device according to another embodiment. For example, FIG. 19 is a layout diagram illustrating a shielding pattern, FIG. 20 is a layout diagram illustrating a shielding pattern and a first active pattern, FIG. 21 is a layout diagram illustrating a shielding pattern, a first active pattern, and a first conductive pattern, and FIG. 22 is a layout diagram illustrating a shielding pattern, a first active pattern, a first conductive pattern, and a fifth conductive pattern.

Referring to FIGS. 19 to 22, a display device 30 according to another embodiment may include a first pixel structure PX1 and a second pixel structure PX2 disposed adjacent to the first pixel structure PX1. For example, the first pixel structure PX1 and the second pixel structure PX2 may be symmetrical about a line of symmetry which passes through a middle of the first pixel structure PX1 and the second pixel structure PX2. However, the first and second pixel structures PX1 and PX2 may be substantially the same as the first and second pixel structures PX1 and PX2 included in the display device 20 except for a shape of the shielding pattern SDP. For example, the first and second pixel structures PX1 and PX2 may include the first organic film layer PI1, the first barrier layer BRR1, the second organic film layer PI2, the second barrier layer BRR2, the buffer layer BFR, the first active pattern 1100, the first gate insulating layer GI1, the first conductive pattern 1200, the second gate insulating layer GI2, the second conductive pattern 1300, the first interlayer insulating layer ILD1, the second active pattern 1400, the third gate insulating layer GI3, the third conductive pattern 1500, the second interlayer insulating layer ILD2, the fourth conductive pattern 1600, the first via insulating layer VIA1, the fifth conductive pattern 1700, and the second via insulating layer VIA2 described above. Hereinafter, the shape of the shielding pattern SDP will be mainly described.

As shown in FIG. 19, the shielding pattern SDP included in the display device 30 may be disposed on the second barrier layer BRR2. In an embodiment, the shielding pattern SDP may extend along the second direction D2 and may be spaced apart in the first direction D1.

The shielding pattern SDP may include a first pattern PTN1 and a second pattern PTN2. The first pattern PTN1 may include a first portion PRT1 and a second portion PRT2. The first pattern PTN1 and the second pattern PTN2 may be symmetrical about a line of symmetry which passes through a middle of the first pattern PTN1 and the second pattern PTN2.

As shown in FIG. 20, the first portion PRT1 may overlap the first active pattern 1100. As shown in FIG. 21, the first portion PRT1 may completely overlap the first gate electrode 1221. In other words, the shape of the first portion PRT1 may be substantially the same as the shape of the first gate electrode 1221 and the size of the first portion PRT1 may be greater than or equal to the size of the first gate electrode 1221. As shown in FIG. 22, the second portion PRT2 may overlap the high power voltage line 1720. For example, the second portion PRT2 may be disposed along the high power voltage line 1720.

The shielding pattern SDP may shield the first active pattern 1100 from the polarized organic materials of the second organic film layer PI2. Accordingly, the back channel may not be formed in the first active pattern 1100 and electrical characteristics of the first transistor T1 may not be changed. Accordingly, the display quality of the display device 30 may be improved.

Figure 23:
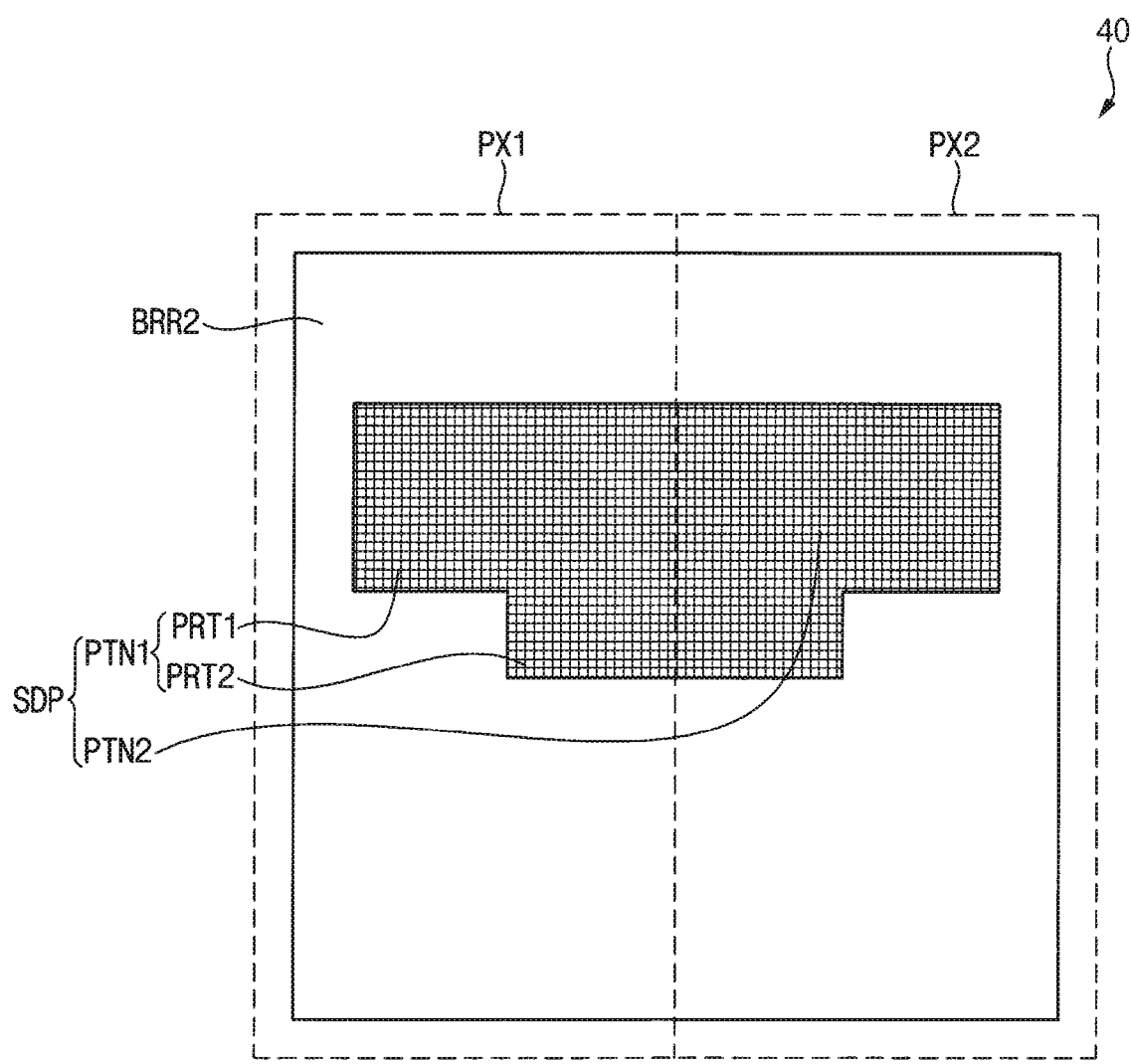
FIGS. 23, 24, 25, 26, 27 and 28 are layout diagrams illustrating a display device according to still another embodiment.
Figure 24:
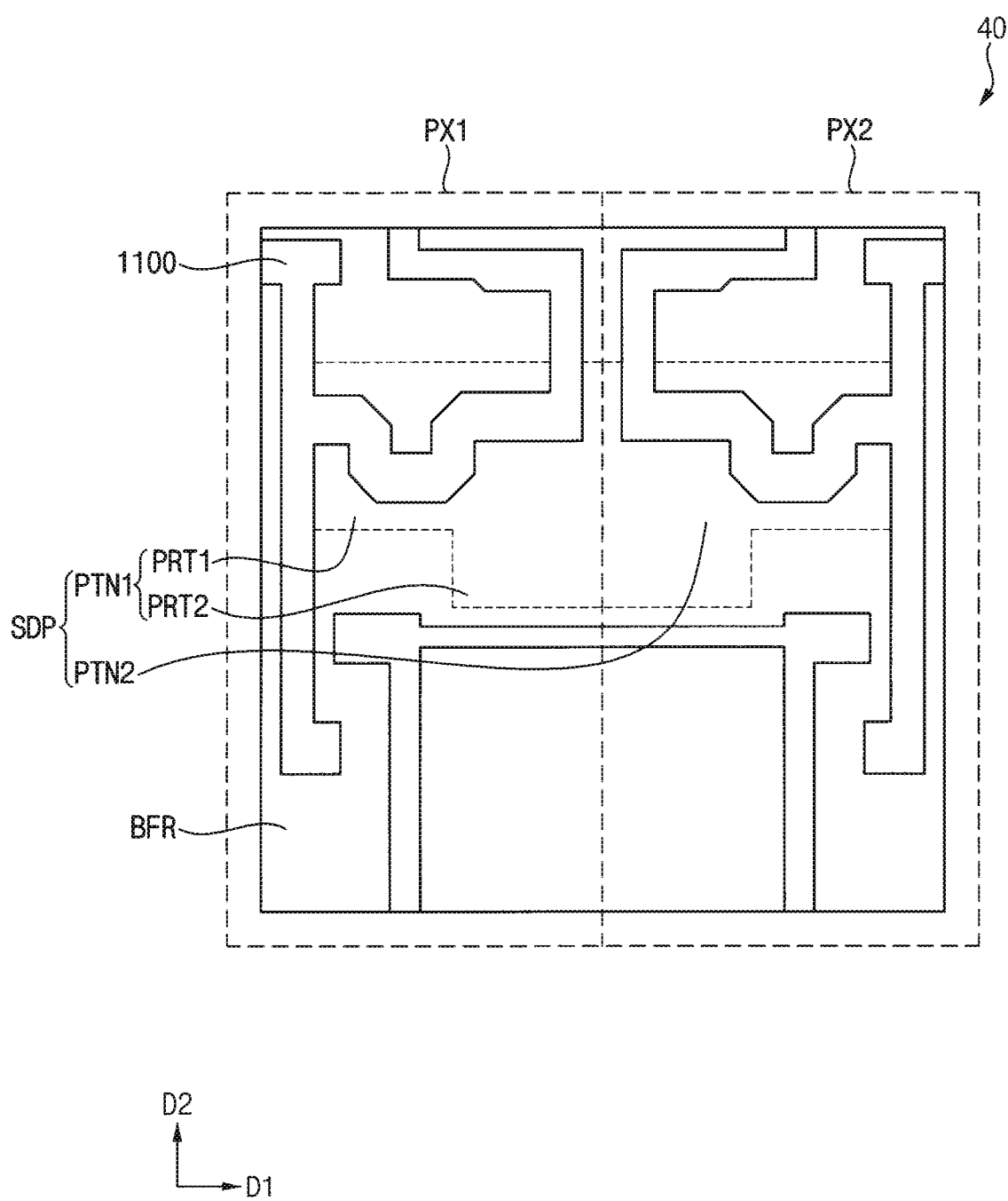
Figure 25:
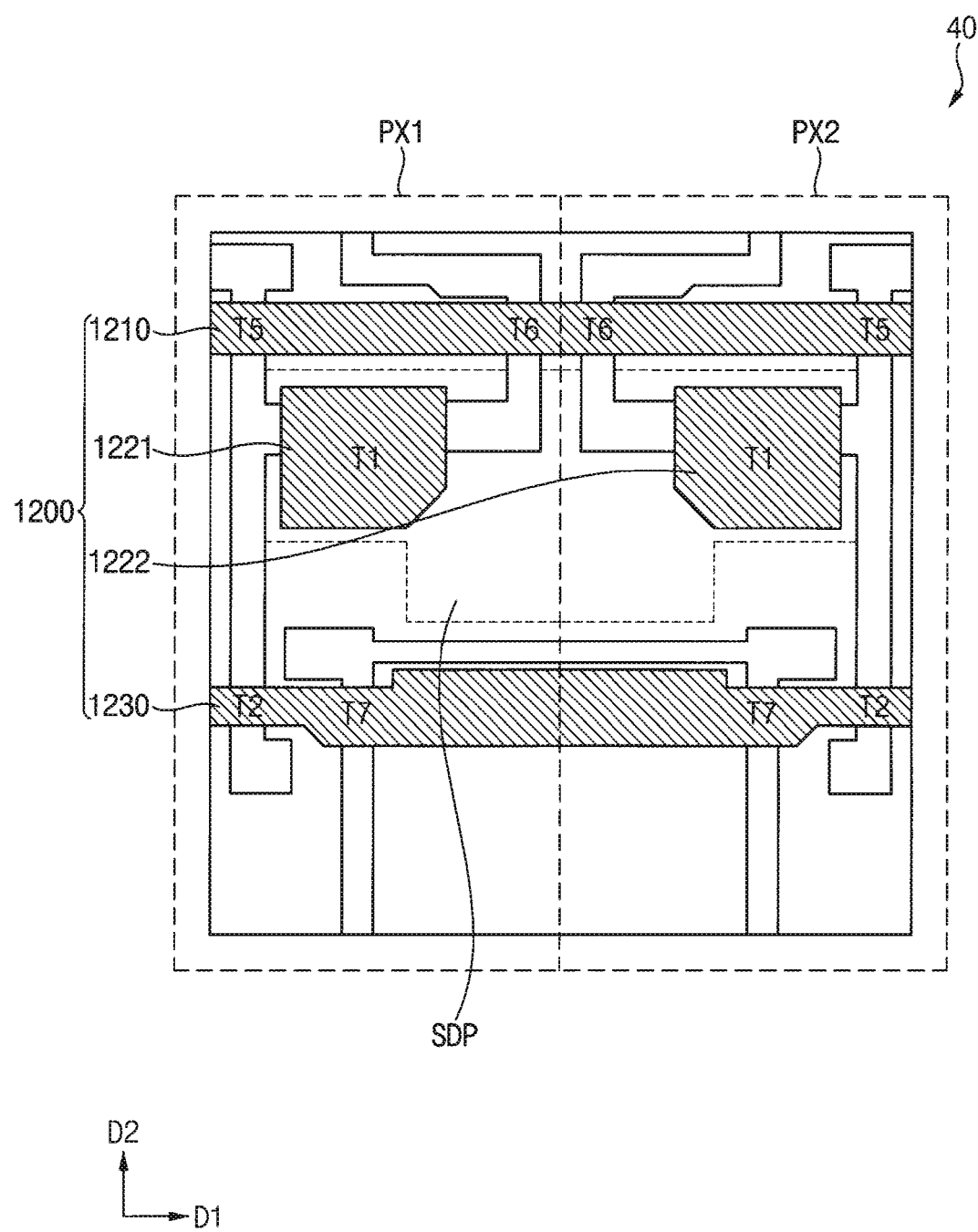
Figure 26:
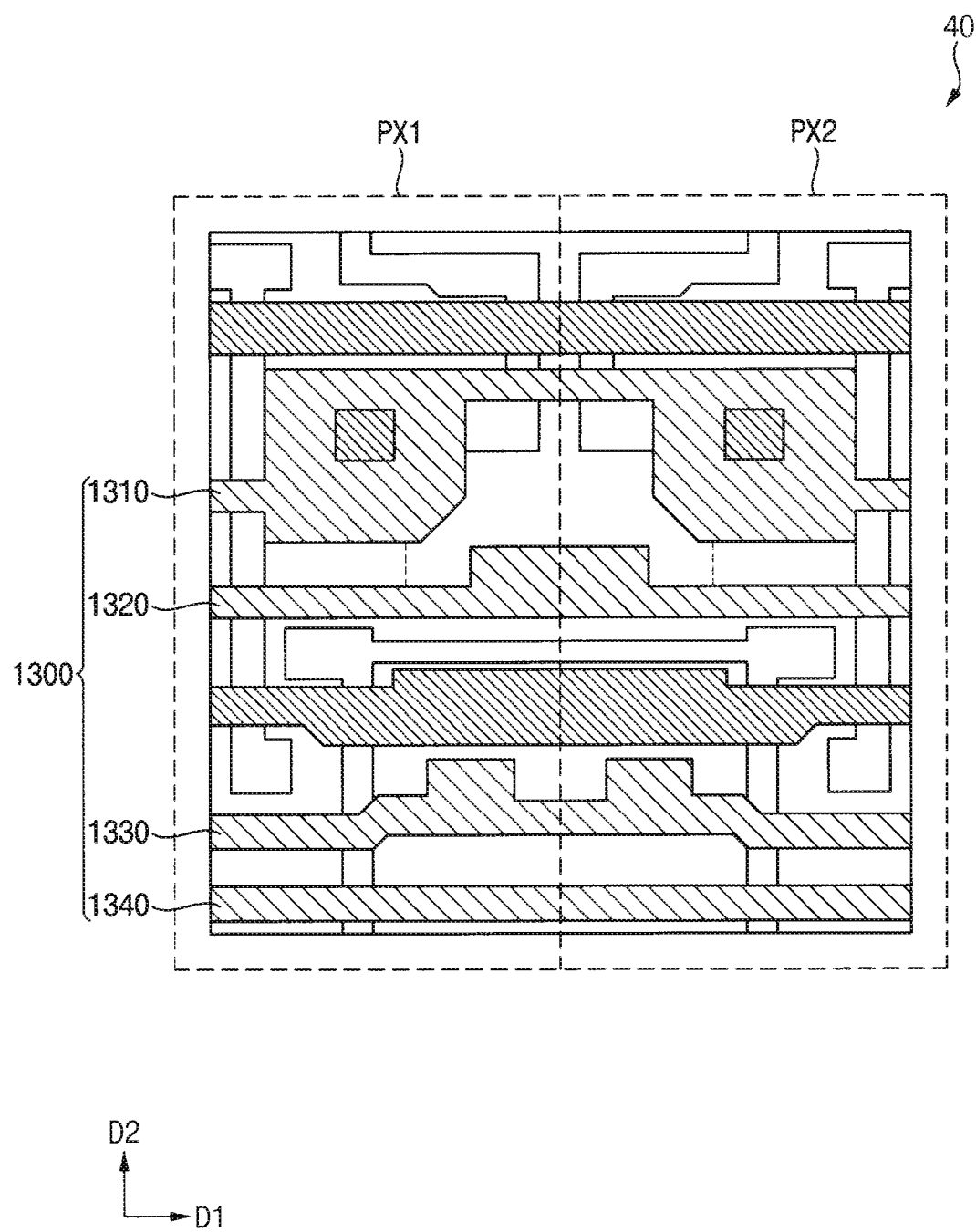
Figure 27:
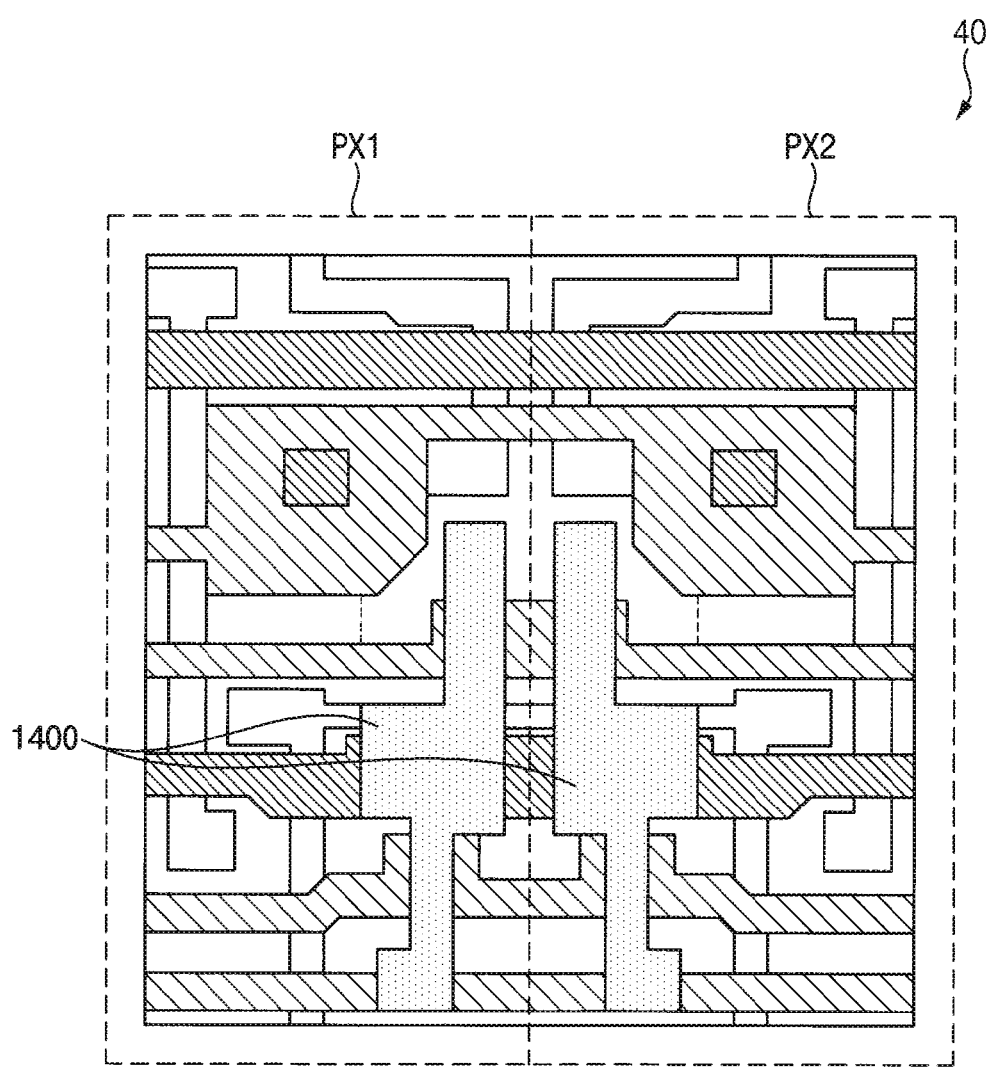
Figure 28:
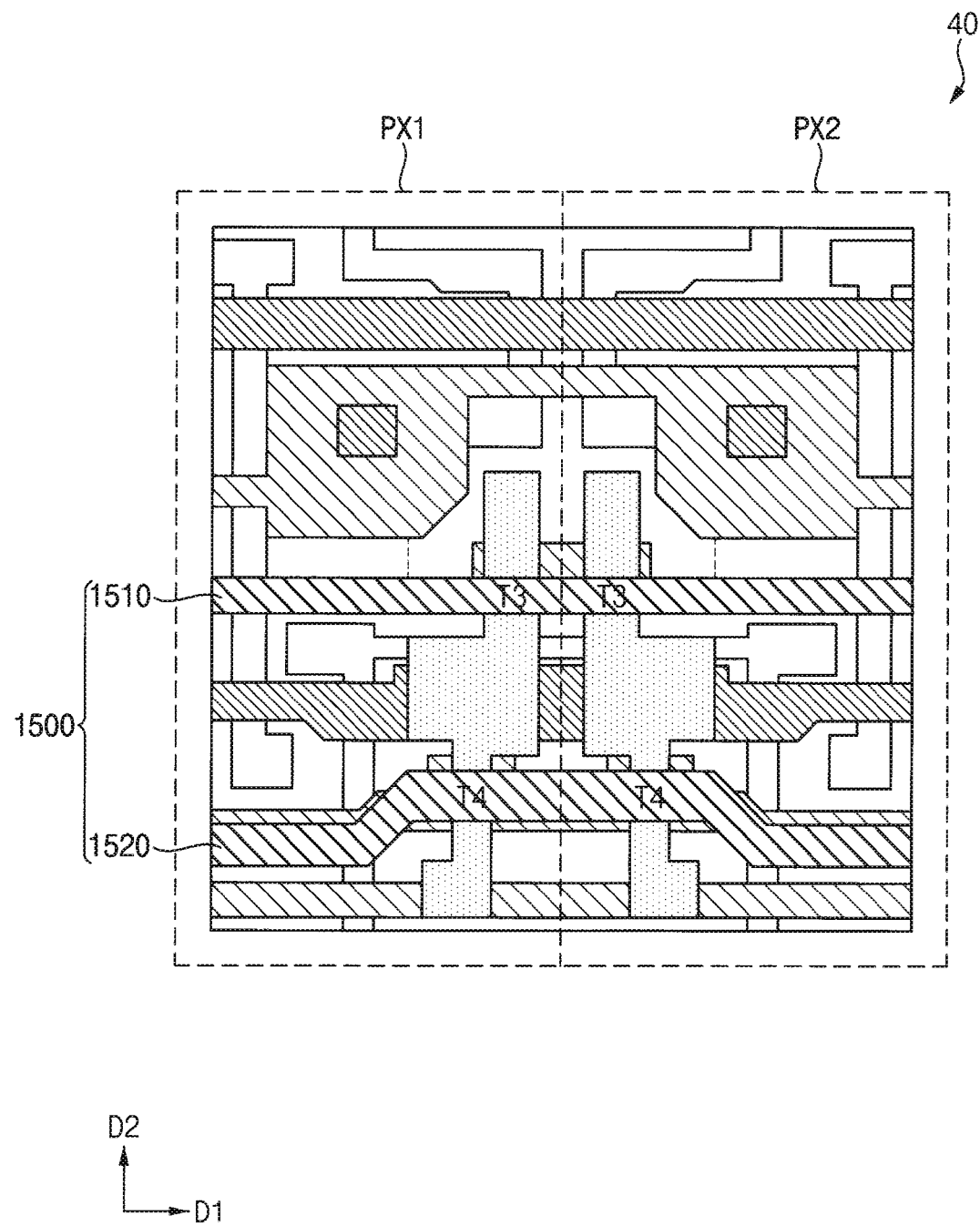

FIGS. 23 to 28 are layout diagrams illustrating a display device according to still another embodiment. For example, FIG. 23 is a layout diagram illustrating a shielding pattern, FIG. 24 is a layout diagram illustrating a shielding pattern and a first active pattern, FIG. 25 is a layout diagram illustrating a shielding pattern, a first active pattern, and a first conductive pattern, FIG. 26 is a layout diagram illustrating a shielding pattern, a first active pattern, a first conductive pattern, and a second conductive pattern, FIG. 27 is a layout diagram illustrating a shielding pattern, a first active pattern, a first conductive pattern, a second conductive pattern, and a second active pattern, and FIG. 28 is a layout diagram illustrating a shielding pattern, a first active pattern, a first conductive pattern, a second conductive pattern, a second active pattern, and a third conductive pattern.

Referring to FIGS. 23 to 28, a display device 40 according to still another embodiment may include a first pixel structure PX1 and a second pixel structure PX2 disposed adjacent to the first pixel structure PX1. For example, the first pixel structure PX1 and the second pixel structure PX2 may be symmetrical about a line of symmetry which passes through a middle of the first pixel structure PX1 and the second pixel structure PX2. However, the first and second pixel structures PX1 and PX2 may be substantially the same as the first and second pixel structures PX1 and PX2 included in the display device 20 except for a shape of the shielding pattern SDP. For example, the first and second pixel structures PX1 and PX2 may include the first organic film layer PI1, the first barrier layer BRR1, the second organic film layer PI2, the second barrier layer BRR2, the buffer layer BFR, the first active pattern 1100, the first gate insulating layer GI1, the first conductive pattern 1200, the second gate insulating layer GI2, the second conductive pattern 1300, the first interlayer insulating layer ILD1, the second active pattern 1400, the third gate insulating layer GI3, the third conductive pattern 1500, the second interlayer insulating layer ILD2, the fourth conductive pattern 1600, the first via insulating layer VIA1, the fifth conductive pattern 1700, and the second via insulating layer VIA2 described above. Hereinafter, the shape of the shielding pattern SDP will be mainly described.

As shown in FIG. 23, the shielding pattern SDP included in the display device 40 may be disposed on the second barrier layer BRR2. In an embodiment, the shielding pattern SDP may have an island shape.

The shielding pattern SDP may include a first pattern PTN1 and a second pattern PTN2. The first pattern PTN1 may include a first portion PRT1 and a second portion PRT2. The first pattern PTN1 and the second pattern PTN2 may be symmetrical about a line of symmetry which passes through a middle of the first pattern PTN1 and the second pattern PTN2. The first and second patterns PTN1 and PTN2 may be connected to each other.

As shown in FIG. 24, the first portion PRT1 may overlap the first active pattern 1100. As shown in FIG. 25, the first portion PRT1 may completely overlap the first gate electrode 1221. In other words, the size of the first portion PRT1 may be greater than or equal to the size of the first gate electrode 1221. As shown in FIGS. 26 to 28, the second portion PRT2 may overlap the third gate line 1320, the second active pattern 1400, and the fifth gate line 1510.

The shielding pattern SDP may shield the first active pattern 1100 from the polarized organic materials of the second organic film layer PI2. Accordingly, the back channel may not be formed in the first active pattern 1100 and electrical characteristics of the first transistor T1 may not be changed. Accordingly, the display quality of the display device 40 may be improved.

In addition, the shielding pattern SDP may shield the second active pattern 1400 from the polarized organic materials. Accordingly, the back channel may not be formed in the second active pattern 1400 and electrical characteristics of the third transistor T3 may not be changed. Accordingly, the display quality of the display device 40 may be improved.

Figure 29:
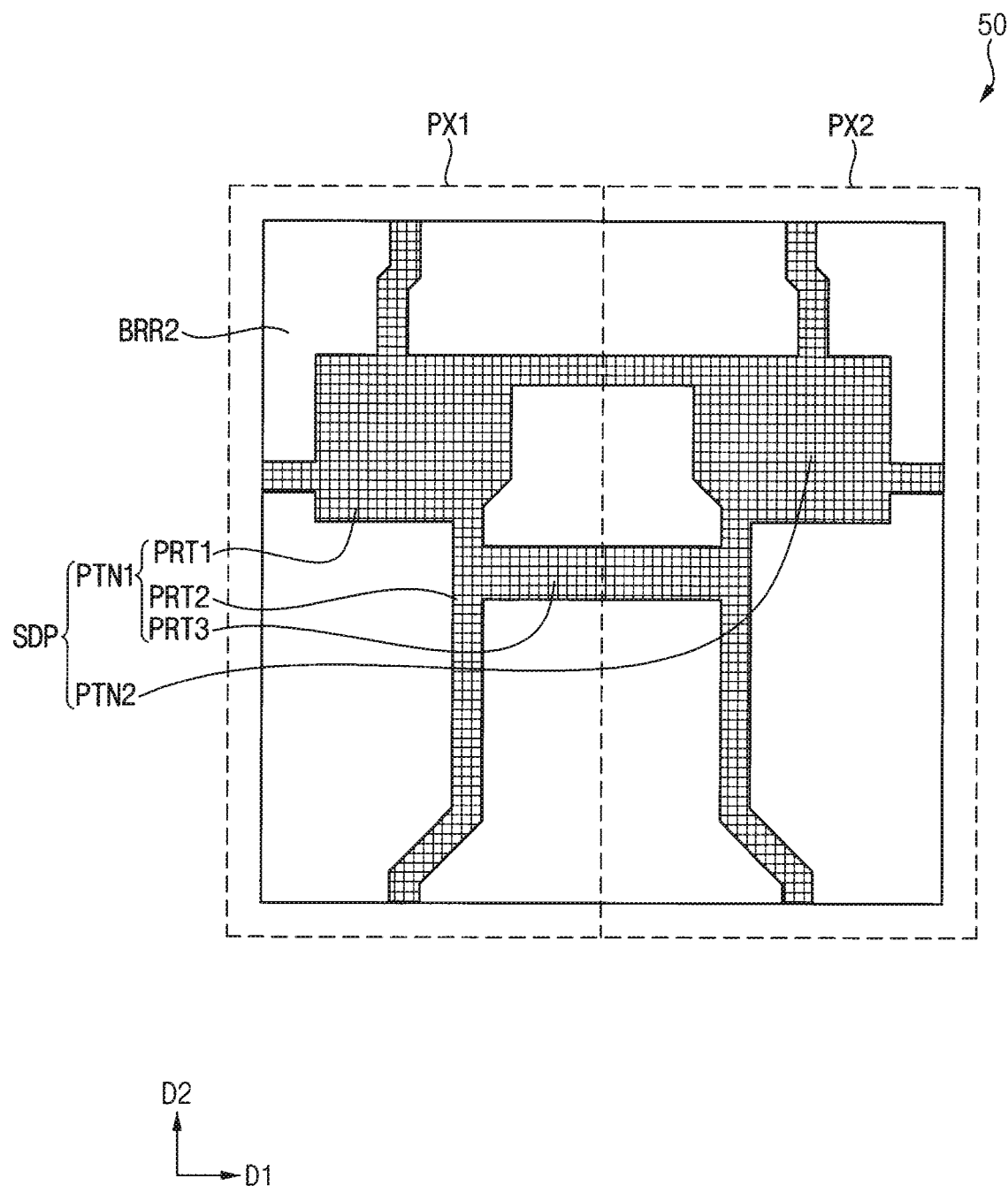
FIGS. 29, 30, 31, 32, 33, 34 and 35 are layout diagrams illustrating a display device according to still another embodiment.
Figure 30:
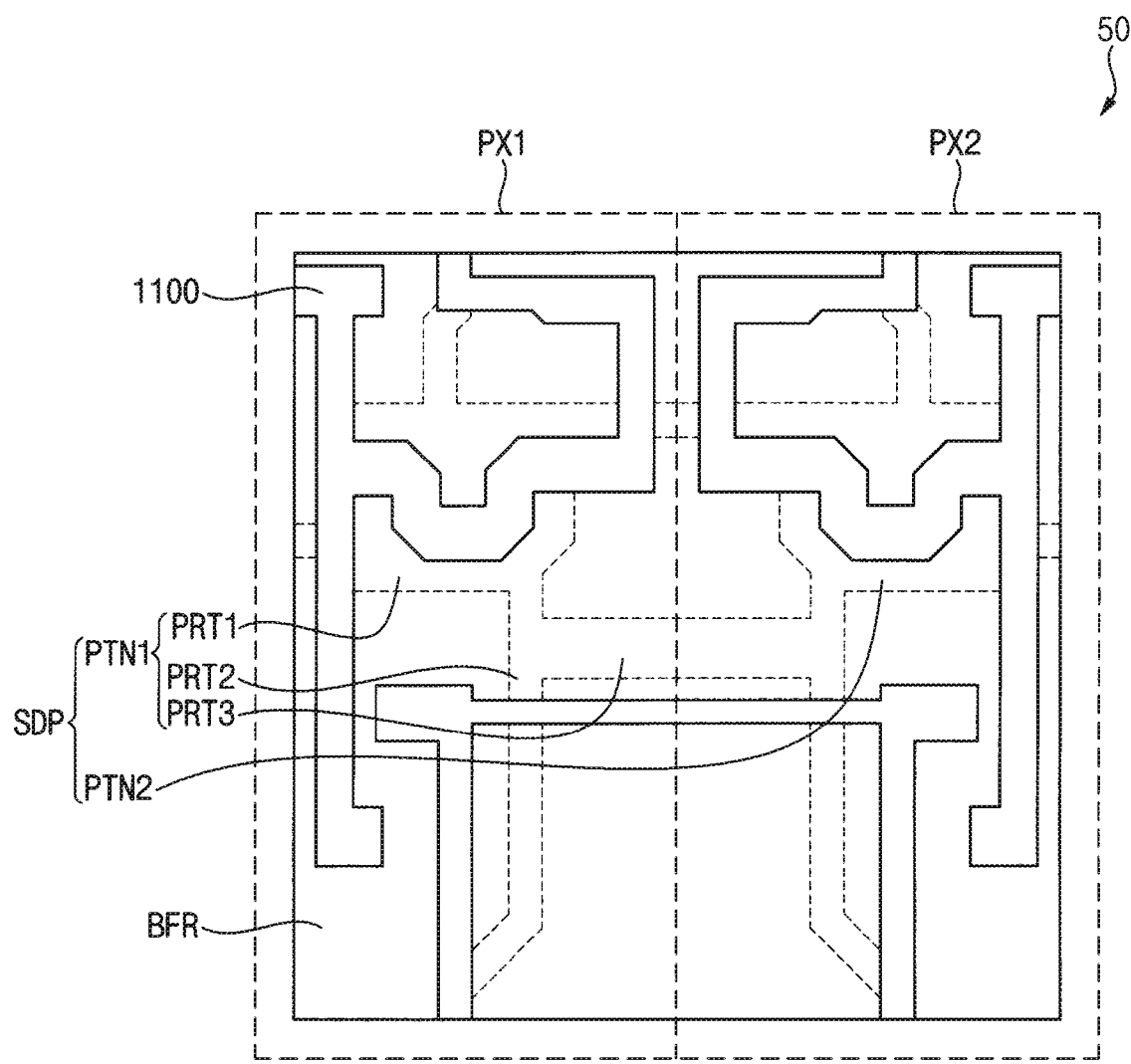
Figure 31:
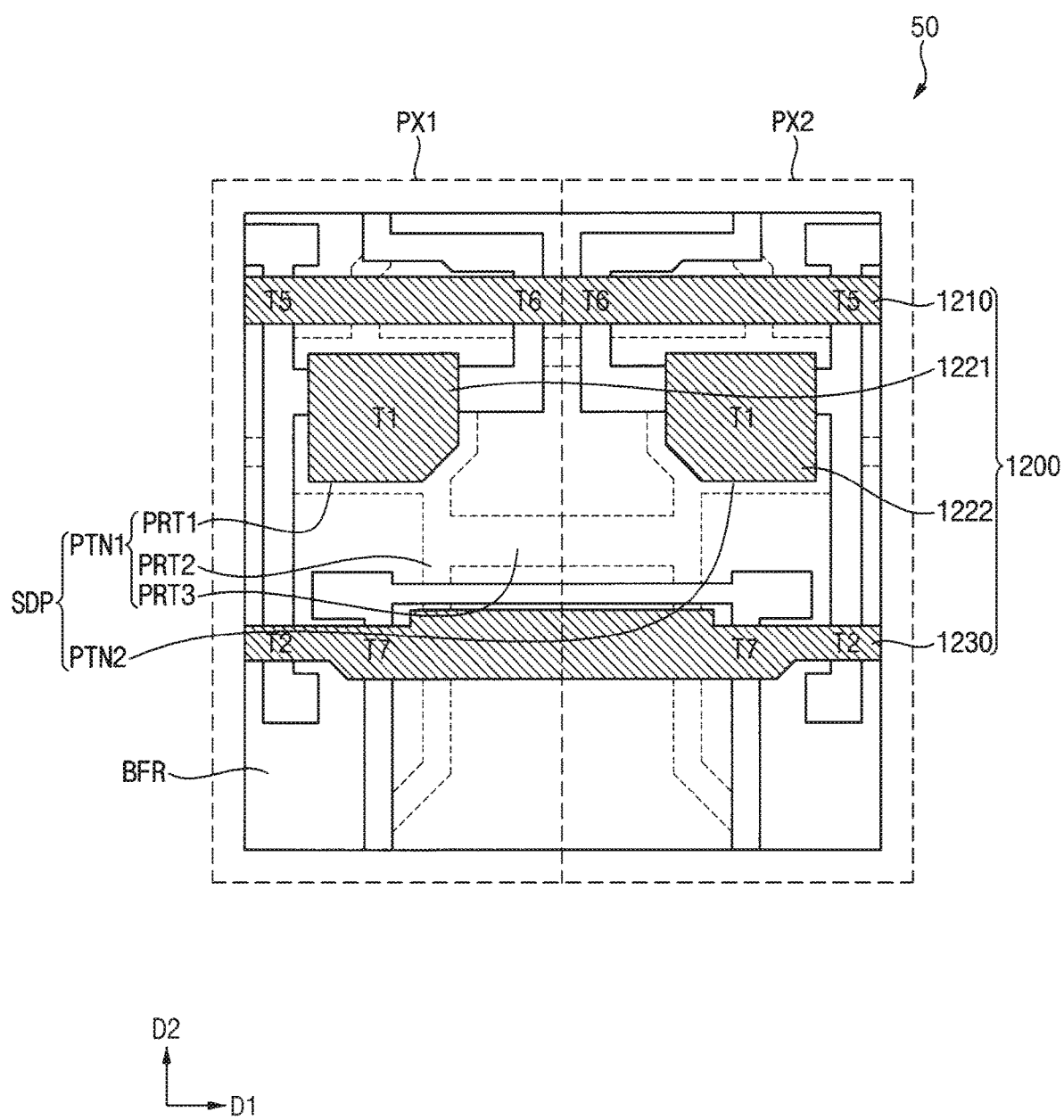
Figure 32:
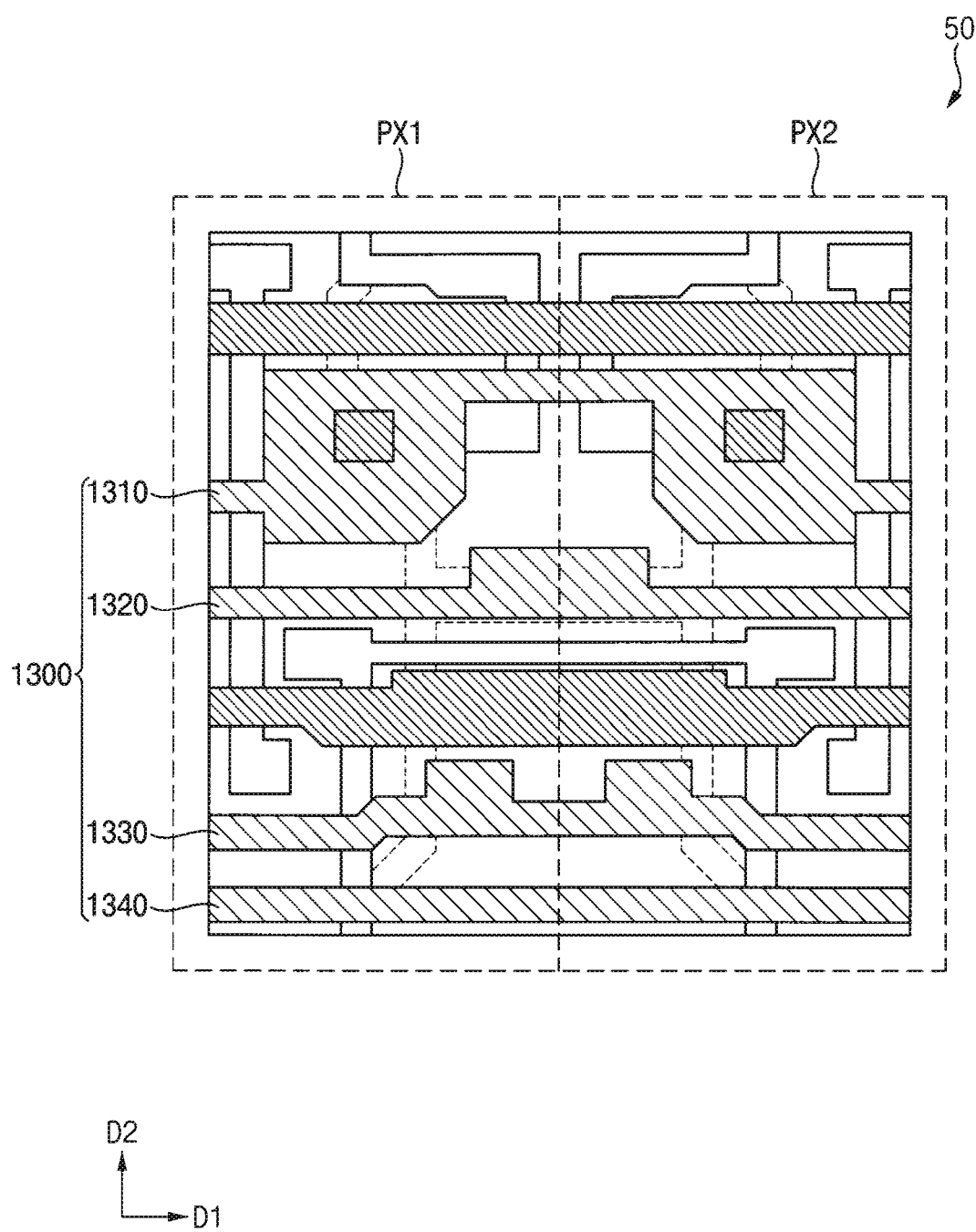
Figure 33:
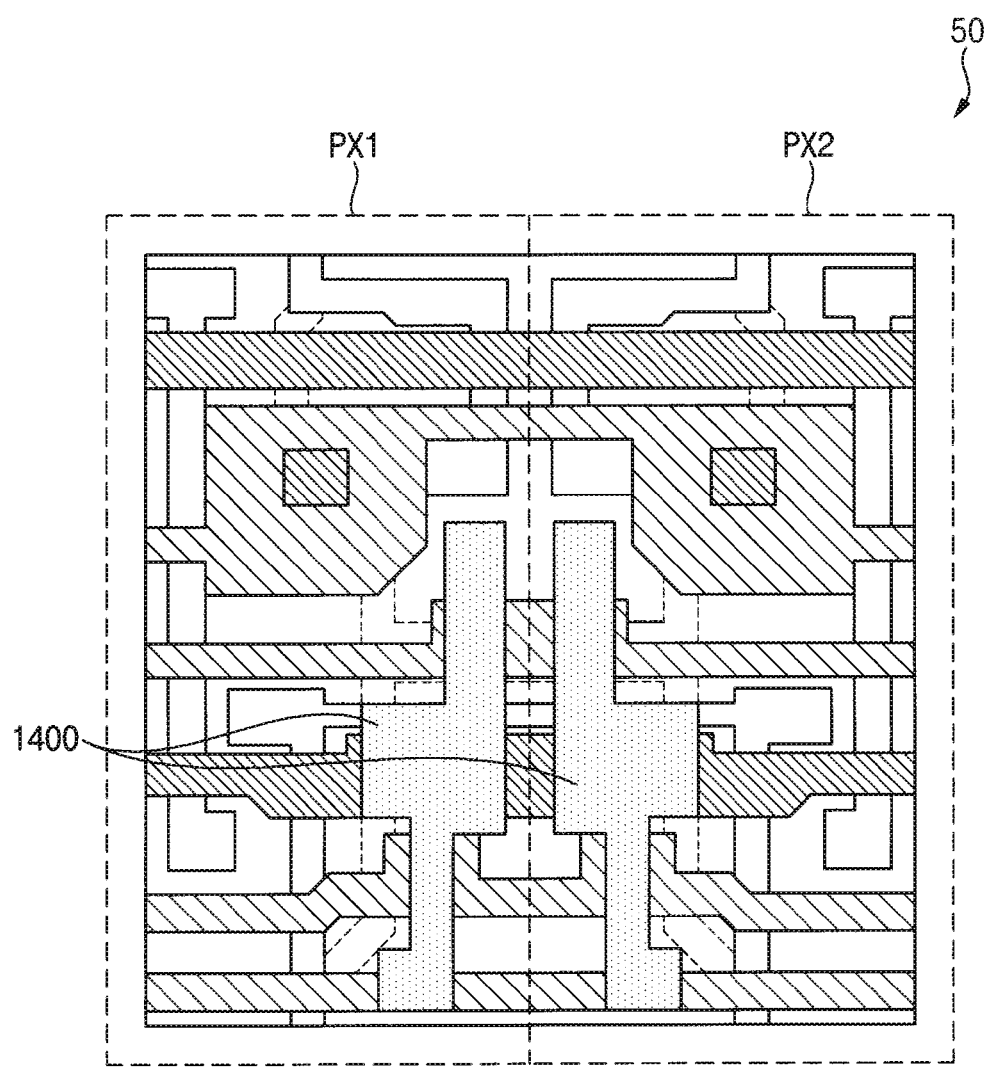
Figure 34:
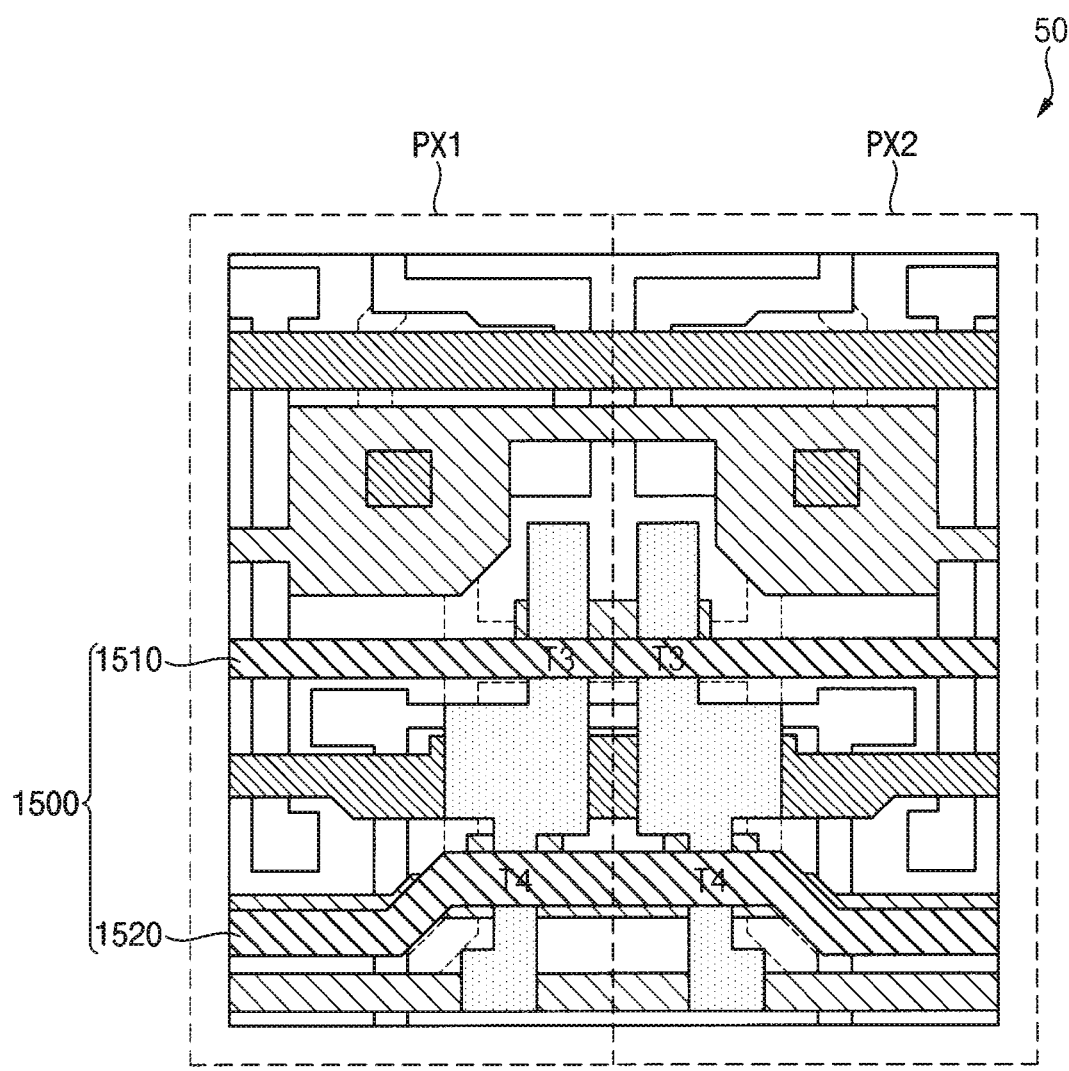
Figure 35:
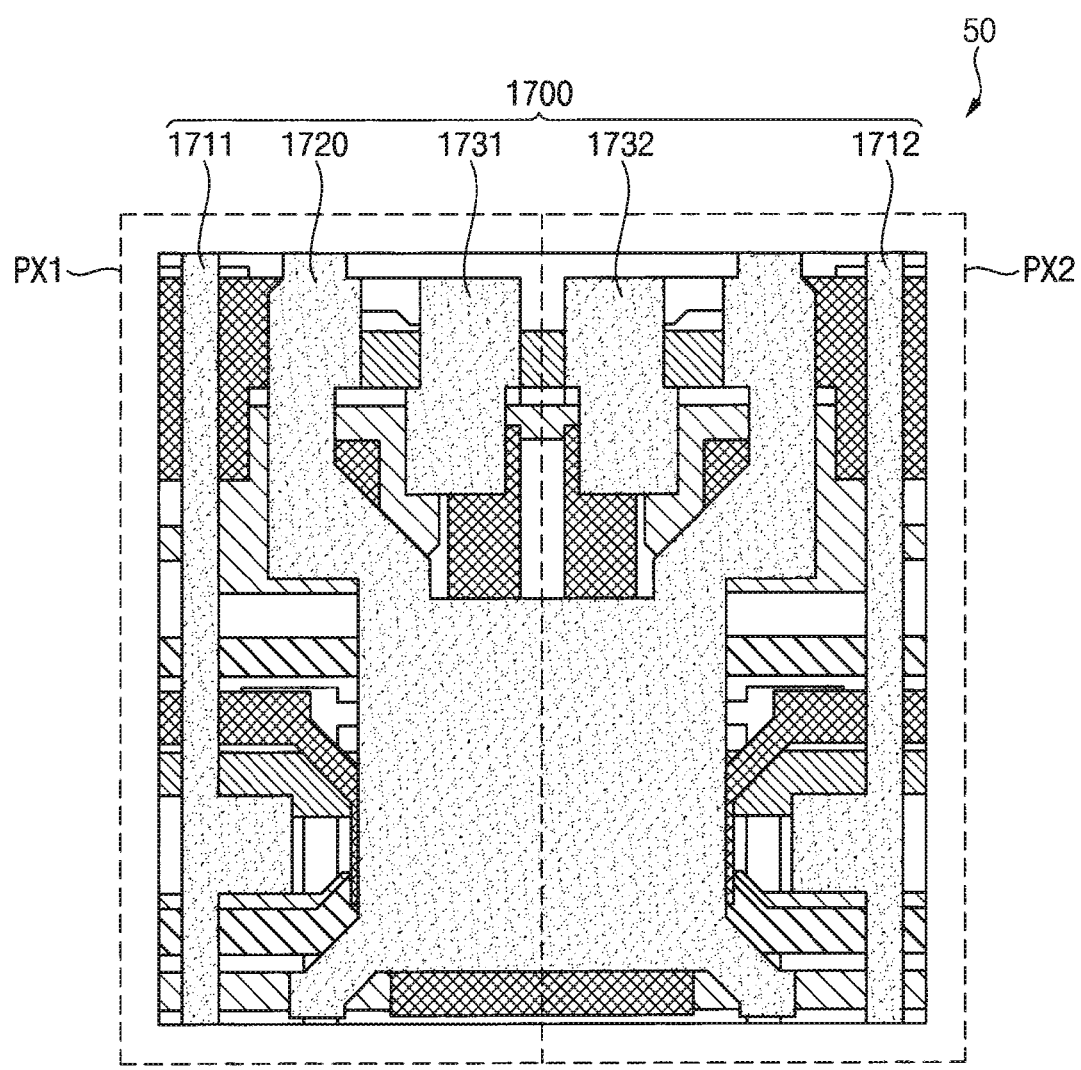

FIGS. 29 to 35 are layout diagrams illustrating a display device according to still another embodiment. For example, FIG. 29 is a layout diagram illustrating a shielding pattern, FIG. 30 is a layout diagram illustrating a shielding pattern and a first active pattern, FIG. 31 is a layout diagram illustrating a shielding pattern, a first active pattern, and a first conductive pattern, FIG. 32 is a layout diagram illustrating a shielding pattern, a first active pattern, a first conductive pattern, and a second conductive pattern, FIG. 33 is a layout diagram illustrating a shielding pattern, a first active pattern, a first conductive pattern, a second conductive pattern, and a second active pattern, FIG. 34 is a layout diagram illustrating a shielding pattern, a first active pattern, a first conductive pattern, a second conductive pattern, a second active pattern, and a third conductive pattern, FIG. 35 is a layout diagram illustrating a shielding pattern, a first active pattern, a first conductive pattern, a second conductive pattern, a second active pattern, a third conductive pattern, and a fifth conductive pattern.

Referring to FIGS. 29 to 35, a display device 50 according to still another embodiment may include a first pixel structure PX1 and a second pixel structure PX2 adjacent to the first pixel structure PX1. For example, the first pixel structure PX1 and the second pixel structure PX2 may be symmetrical about a line of symmetry which passes through a middle of the first pixel structure PX1 and the second pixel PX2. However, the first and second pixel structures PX1 and PX2 may be substantially the same as the first and second pixel structures PX1 and PX2 included in the display device 20 except for a shape of the shielding pattern SDP. For example, the first and second pixel structures PX1 and PX2 may include the first organic film layer PI1, the first barrier layer BRR1, the second organic film layer PI2, the second barrier layer BRR2, the buffer layer BFR, the first active pattern 1100, the first gate insulating layer GI1, the first conductive pattern 1200, the second gate insulating layer GI2, the second conductive pattern 1300, the first interlayer insulating layer ILD1, the second active pattern 1400, the third gate insulating layer GI3, the third conductive pattern 1500, the second interlayer insulating layer ILD2, the fourth conductive pattern 1600, the first via insulating layer VIA1, the fifth conductive pattern 1700, and the second via insulating layer VIA2 described above. Hereinafter, the shape of the shielding pattern SDP will be mainly described.

As shown in FIG. 29, the shielding pattern SDP included in the display device 50 may be disposed on the second barrier layer BRR2. In an embodiment, the shielding pattern SDP may have a mesh structure.

The shielding pattern SDP may include a first pattern PTN1 and a second pattern PTN2. The first pattern PTN1 may include a first portion PRT1, a second portion PRT2, and a third portion PRT3. For example, the second portion PRT2 may extend along the second direction D2, and the third portion PRT3 may extend along the first direction D1. The first pattern PTN1 and the second pattern PTN2 may be symmetrical about a line of symmetry which passes through a middle of the first pattern PTN1 and the second pattern PTN2.

As shown in FIG. 30, the first portion PRT1 may overlap the first active pattern ACT1. As shown in FIG. 31, the first portion PRT1 may completely overlap the first gate electrode 1221. In other words, the shape of the first portion PRT1 may be substantially the same as the shape of the first gate electrode 1221, and the size of the first portion PRT1 may be greater than or equal to the size of the first gate electrode 1221. As shown in FIGS. 32 to 34, the third portion PRT3 may overlap the third gate line 1320, the second active pattern 1400, and the fifth gate line 1510. As shown in FIG. 35, the second portion PRT2 may overlap the high power voltage line 1720. For example, the second portion PRT2 may be disposed along the high power voltage line 1720.

The shielding pattern SDP may shield the first active pattern 1100 from the polarized organic materials of the second organic film layer PI2. Accordingly, the back channel may not be formed in the first active pattern 1100 and electrical characteristics of the first transistor T1 may not be changed. Accordingly, the display quality of the display device 50 may be improved.

In addition, the shielding pattern SDP may shield the second active pattern 1400 from the polarized organic materials. Accordingly, the back channel may not be formed in the second active pattern 1400 and electrical characteristics of the third transistor T3 may not be changed. Accordingly, the display quality of the display device 50 may be improved.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display panel comprising:
   a substrate;
   a first barrier layer disposed on the substrate;
   a shielding pattern disposed on the first barrier layer and having a mesh shape;
   a second barrier layer covering the shielding pattern and disposed on the first barrier layer;
   a first active pattern disposed on the second barrier layer and overlapping the shielding pattern in a plan view;
   a gate electrode disposed on the first active pattern;
   an emission control line disposed on the first active pattern and adjacent to one side of the gate electrode in a plan view;
   a second active pattern disposed on the emission control line; and
   an upper compensation control line disposed on the second active pattern and adjacent to the other side of the gate electrode in a plan view,
   wherein the shielding pattern comprises a first pattern and a second pattern, the first pattern and the second pattern are disposed on a same layer as the shielding pattern, and
   wherein each of the first pattern and the second pattern comprises a first portion overlapping the gate electrode in a plan view and a second portion having a width narrower than a width of the first portion in a first direction.

2. The display panel of claim 1,
   wherein the second pattern is connected to the first pattern, and
   wherein the first pattern and the second pattern are symmetrical about a line of symmetry which passes through a middle of the first pattern and the second pattern.

3. The display panel of claim 2, wherein the first portion completely overlaps the gate electrode in a plan view.

4. The display panel of claim 2, further comprising:
   a high power voltage line disposed on the upper compensation control line and provided with a high power voltage,
   wherein the second portion overlaps the high power voltage line in a plan view.

5. The display panel of claim 1, wherein a thickness of the shielding pattern is equal to a thickness of the first barrier layer.

6. The display panel of claim 1, wherein the shielding pattern comprises amorphous silicon.

7. The display panel of claim 6, wherein the first active pattern comprises polycrystalline silicon, and
   wherein the second active pattern comprises an oxide semiconductor.

8. The display panel of claim 7, wherein positive ions are doped in the first active pattern, and
   wherein the positive ions are doped in the shielding pattern.

9. The display panel of claim 7, wherein positive ions are doped in the first active pattern, and
   wherein the negative ions are doped in the shielding pattern.

10. The display panel of claim 1, wherein a constant voltage is applied to the shielding pattern.

11. The display panel of claim 1, wherein the shielding pattern is electrically floating.

12. The display panel of claim 1, further comprising:
    a third barrier layer disposed under the substrate; and
    an organic film layer disposed under the third barrier layer.

13. The display panel of claim 12, wherein a thickness of the first barrier layer is smaller than a thickness of the second barrier layer.

14. The display panel of claim 12, wherein a thickness of the third barrier layer is equal to a sum of a thickness of the first barrier layer and a thickness of the second barrier layer.

15. A display panel comprising:
    a substrate;
    a first barrier layer disposed on the substrate;
    a shielding pattern disposed on the first barrier layer and having a mesh shape;
    a second barrier layer covering the shielding pattern and disposed on the first barrier layer;
    a first active pattern disposed on the second barrier layer and overlapping the shielding pattern in a plan view;
    a gate electrode disposed on the first active pattern;
    an emission control line disposed on the first active pattern and adjacent to one side of the gate electrode in a plan view;
    a second active pattern disposed on the emission control line;
    an upper compensation control line disposed on the second active pattern and adjacent to the other side of the gate electrode in a plan view;
    a lower compensation control line disposed between the gate electrode and the second active pattern, wherein the upper compensation control line overlaps the lower compensation control line in a plan view and is electrically connected to the lower compensation line.

16. A display device comprising a display panel, the display panel comprises:
   a substrate;
   a first barrier layer disposed on the substrate;
   a shielding pattern disposed on the first barrier layer and having a mesh shape;
   a second barrier layer covering the shielding pattern and disposed on the first barrier layer;
   a first active pattern disposed on the second barrier layer and overlapping the shielding pattern in a plan view;
   a gate electrode disposed on the first active pattern;
   an emission control line disposed on the first active pattern and adjacent to one side of the gate electrode in a plan view;
   a second active pattern disposed on the emission control line; and
   an upper compensation control line disposed on the second active pattern and adjacent to the other side of the gate electrode in a plan view, wherein the shielding pattern comprises a first pattern and a second pattern, the first pattern and the second pattern are disposed on a same layer as the shielding pattern, and wherein each of the first pattern and the second pattern comprises a first portion overlapping the gate electrode in a plan view and a second portion having a width narrower than a width of the first portion in a first direction.

17. The display device of claim 16, further comprising:

an optical sensor disposed under the display panel and overlapping a fingerprint recognition area in a plan view; and an air layer disposed between the display panel and the optical sensor and overlapping the fingerprint recognition area in a plan view, wherein the shielding pattern overlaps the fingerprint recognition area in a plan view.

* * * * *